United States Patent
Kise et al.

(10) Patent No.: US 12,205,867 B2
(45) Date of Patent: Jan. 21, 2025

(54) HEAT SINK AND SEMICONDUCTOR MODULE

(71) Applicant: Mitsubishi Electric Corporation, Tokyo (JP)

(72) Inventors: Koji Kise, Tokyo (JP); Yumi Genda, Tokyo (JP); Hiroaki Tatsumi, Tokyo (JP); Daisuke Morita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 496 days.

(21) Appl. No.: 17/626,500

(22) PCT Filed: Sep. 4, 2019

(86) PCT No.: PCT/JP2019/034818
§ 371 (c)(1),
(2) Date: Jan. 12, 2022

(87) PCT Pub. No.: WO2021/044550
PCT Pub. Date: Mar. 11, 2021

(65) Prior Publication Data
US 2022/0246495 A1    Aug. 4, 2022

(51) Int. Cl.
*H01L 23/46* (2006.01)
*H01L 23/473* (2006.01)

(52) U.S. Cl.
CPC .................... *H01L 23/473* (2013.01)

(58) Field of Classification Search
CPC ... H01L 23/36–3738; H01L 23/44–445; H01L 23/473–4735; H01L 23/467;
(Continued)

(56) References Cited

U.S. PATENT DOCUMENTS

| 2001/0004370 A1 | 6/2001 | Miyajima et al. |
| 2006/0219387 A1 | 10/2006 | Atarashi et al. |
| 2009/0250195 A1 | 10/2009 | Yoshida et al. |

(Continued)

FOREIGN PATENT DOCUMENTS

| JP | 2006-287017 A | 10/2006 |
| JP | 2007-335588 A | 12/2007 |

(Continued)

OTHER PUBLICATIONS

International Search Report and Written Opinion mailed on Nov. 19, 2019, received for PCT Application PCT/JP2019/034818, Filed on Sep. 4, 2019, 10 pages including English Translation.

(Continued)

*Primary Examiner* — Moin M Rahman
(74) *Attorney, Agent, or Firm* — XSENSUS LLP

(57) ABSTRACT

A heat sink having a coolant flow path formed inside through which a coolant flows includes: a heat transfer plate having a first surface on which a semiconductor device is disposed and a second surface; a junction flow path-forming plate having a third surface and a fourth surface; a first partition wall provided in contact with the second surface and the third surface; and first fins provided in contact with the second surface. The coolant flow path includes a first flow path. A plurality of first divided regions separated by the at least one first partition wall are formed in the first flow path. The plurality of first fins are arranged by being spaced side by side in the first divided regions.

13 Claims, 18 Drawing Sheets

(58) Field of Classification Search
CPC ... H01L 23/427; H01L 23/4093; H01L 23/46; H01L 21/4871–4882; H01L 33/64–648; H01L 2933/0075; H01L 51/529; H05K 7/20; H05K 7/20154; H05K 7/20263; H05K 7/20409; F28D 1/00; F28F 3/02
See application file for complete search history.

(56) References Cited

U.S. PATENT DOCUMENTS

| | | |
|---|---|---|
| 2012/0008655 A1 | 1/2012 | Niwa |
| 2012/0018741 A1 | 1/2012 | Sato |
| 2016/0084489 A1 | 3/2016 | Yamaguchi et al. |
| 2021/0010761 A1* | 1/2021 | Watanabe ................ H05K 7/20 |
| 2021/0247151 A1* | 8/2021 | König ...................... F28F 3/02 |

FOREIGN PATENT DOCUMENTS

| | | |
|---|---|---|
| JP | 2012-19086 A | 1/2012 |
| JP | 2012-44140 A | 3/2012 |
| JP | 2014-150117 A | 8/2014 |
| JP | 2015-153799 A | 8/2015 |
| JP | 2016-66694 A | 4/2016 |

OTHER PUBLICATIONS

German Office Action issued Sep. 2, 2022, in corresponding German Application No. 112019007686.8.

Office Action issued May 1, 2024 in Chinese Patent Application No. 201980099831.X, 18 pages.

* cited by examiner

HEAT SINK AND SEMICONDUCTOR MODULE

CROSS-REFERENCE TO RELATED APPLICATION

The present application is based on PCT filing PCT/JP2019/034818, filed Sep. 4, 2019, the entire contents of which are incorporated herein by reference.

FIELD

The present invention relates to a heat sink for cooling an object to be cooled such as a semiconductor device, and a semiconductor module.

BACKGROUND

Heat sinks for cooling semiconductor devices etc. have been known. For example, Patent Literature 1 discloses a heat sink including a rectangular base plate with a semiconductor device attached to its front side, a plurality of fins attached to the back side of the base plate and arranged in parallel with each other, and a coolant nozzle that ejects a coolant toward the back side of the base plate.

The heat sink disclosed in Patent Literature 1 is provided with twelve fins arranged in six rows in the width direction of the base plate and in two rows in the length direction of the base plate. The coolant nozzle is fitted between the fins aligned in the length direction of the base plate. In a planar view, the coolant nozzle and the central part of the semiconductor device are arranged on a position coinciding with each other.

CITATION LIST

Patent Literature

Patent Literature 1: Japanese Patent Application Laid-open No. 2014-150117

SUMMARY

Technical Problem

However, the heat sink disclosed in Patent Literature 1 has no fins on a position that overlaps with the central part of the semiconductor device, and thus heat generated in the central part of the semiconductor device is less transferred to the coolant via the fins, and the central part of the semiconductor device is insufficiently cooled. As a result, there is a problem that the temperature of the central part of the semiconductor device is difficult to decline.

The present invention has been made in view of the above, and an object thereof is to provide a heat sink that facilitates the reduction of the central part temperature of an object to be cooled, and a semiconductor module.

Solution to Problem

In order to solve the above-described problem and achieve the object, a heat sink according to the present invention has a coolant flow path formed inside through which a coolant to cool an object to be cooled flows, the heat sink includes: a first plate having a first surface on which the object to be cooled is disposed and a second surface that is a back surface of the first surface; a second plate having a third surface facing the second surface and a fourth surface that is a back surface of the third surface; a first partition wall provided in contact with the second surface of the first plate and the third surface of the second plate; and a plurality of first fins provided in contact with the second surface of the first plate. The coolant flow path includes a first flow path formed between the first plate and the second plate. A plurality of first divided regions separated by the first partition wall are formed in the first flow path. The plurality of first fins are arranged by being spaced side by side in the first divided regions. A position where at least part of the first partition wall is projected onto the first surface, or a position where at least part of the first fins are projected onto the first surface coincides with the central part of the object to be cooled.

Advantageous Effects of Invention

The present invention has the effect of facilitating the reduction of the central part temperature of the object to be cooled.

DESCRIPTION OF EMBODIMENTS

Hereinafter, a heat sink and a semiconductor module according to embodiments of the present invention will be described in detail with reference to the drawings. Note that the embodiments are not intended to limit the invention.

First Embodiment

Figure 1:
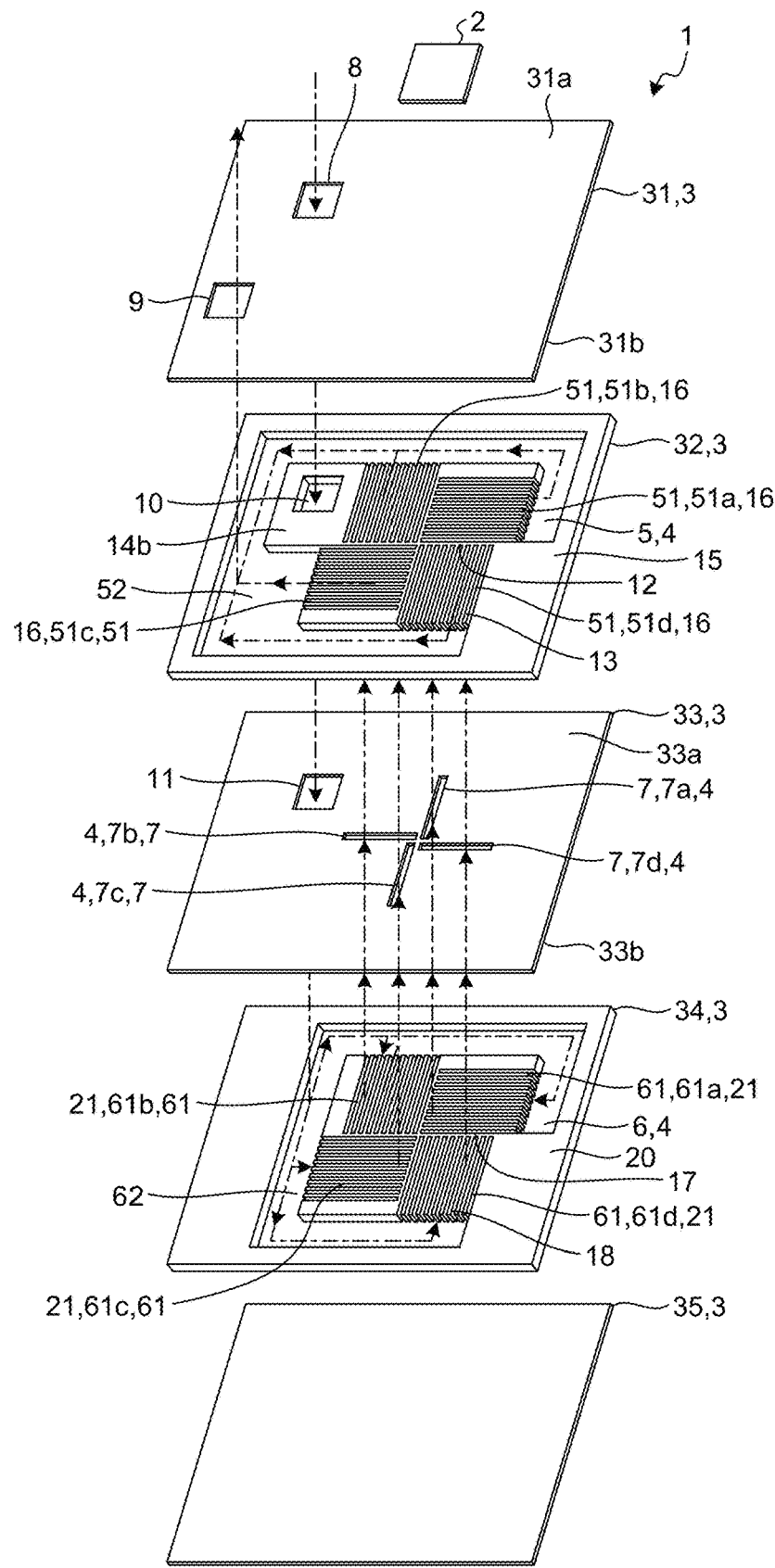
FIG. 1 is an exploded perspective view illustrating a semiconductor module according to a first embodiment of the present invention.

FIG. 1 is an exploded perspective view illustrating a semiconductor module 1 according to a first embodiment of the present invention. Arrows illustrated in FIG. 1 indicate flows of a coolant. As illustrated in FIG. 1, the semiconductor module 1 includes a semiconductor device 2, which is an object to be cooled, and a heat sink 3. The semiconductor device 2 is, for example, a light-emitting device or a power semiconductor. The light-emitting device is, for example, a single laser device or an array laser device. The power semiconductor is formed on a substrate such as a Si substrate, a GaN substrate, or a SiC substrate. When the semiconductor device 2 is driven, heat is generated from the semiconductor device 2.

The heat sink 3 is a member that dissipates heat generated in the semiconductor device 2. The heat sink 3 is formed by stacking a heat transfer plate 31, a first flow path-forming plate 32, a junction flow path-forming plate 33, a second flow path-forming plate 34, and a bottom plate 35. From the side closer to the semiconductor device 2, the heat transfer plate 31, the first flow path-forming plate 32, the junction flow path-forming plate 33, the second flow path-forming plate 34, and the bottom plate 35 are arranged in this order. The heat transfer plate 31, the first flow path-forming plate 32, the junction flow path-forming plate 33, the second flow path-forming plate 34, and the bottom plate 35 are each formed of a metal material having high thermal conductivity. The metal material having high thermal conductivity is, for example, copper or aluminum. The plates 31 to 35 are preferably formed of the same type of metal material. A method of joining the plates 31 to 35 is, for example, diffusion bonding. The plates 31 to 35, which are not limited to a particular shape, are rectangular in the first embodiment. In the first embodiment, the number of plates forming the heat sink 3 is five, but the number of plates forming the heat sink 3 may be six or more. A coolant flow path 4 through which the coolant flows is formed inside the heat sink 3. The coolant is, for example, pure water or antifreeze solution. The coolant flow path 4 will be described in detail later.

The heat transfer plate 31, which is a first plate, has a first surface 31a on which the semiconductor device 2 is disposed and a second surface 31b that is the back surface of the first surface 31a. Heat from the semiconductor device 2 is directly transferred to the heat transfer plate 31. The first surface 31a faces the outside of the heat sink 3. The second surface 31b faces the inside of the heat sink 3. A method of joining the heat transfer plate 31 and the semiconductor device 2 is, for example, soldering. A first opening 8 and a second opening 9 are formed in the heat transfer plate 31. The first opening 8 and the second opening 9 are provided in positions away from the semiconductor device 2. The first opening 8 and the second opening 9 pass through the heat transfer plate 31 in the thickness direction of the heat transfer plate 31. In the first embodiment, the first opening 8 serves as a coolant inlet that causes the coolant to flow into the heat sink 3. In the first embodiment, the second opening 9 serves as a coolant outlet that causes the coolant to flow out of the heat sink 3. The first opening 8 may be used as a coolant outlet, and the second opening 9 may be used as a coolant inlet.

The first flow path-forming plate 32 is a plate that forms a first flow path 5 between the heat transfer plate 31 and the junction flow path-forming plate 33. In the first flow path-forming plate 32, a first outer peripheral wall 15, a plurality of first partition walls 12, and a plurality of first fins 13 are formed. The first outer peripheral wall 15, the first partition walls 12, and the first fins 13 will be described in detail later. In the first flow path-forming plate 32, a plurality of first divided regions 51, a first common header region 52, and a third opening 10 are formed. The first divided regions 51, the first common header region 52, and the third opening 10 pass through the first flow path-forming plate 32 in the thickness direction of the first flow path-forming plate 32. In a planar view, the third opening 10 is disposed in a position coinciding with the first opening 8. The third opening 10 communicates with the first opening 8. A first dividing wall 14b is provided around the third opening 10. The third opening 10 is separated from the first divided regions 51 and the first common header region 52 by the first dividing wall 14b. This prevents the coolant flowing through the third opening 10 from meeting the coolant flowing through the first divided regions 51 and the first common header region 52. The first divided regions 51 and the first common header region 52 will be described in detail later.

The junction flow path-forming plate 33, which is a second plate, is a plate forming a plurality of junction flow paths 7. The junction flow path-forming plate 33 has a third surface 33a facing the second surface 31b and a fourth surface 33b that is the back surface of the third surface 33a. The junction flow paths 7 and a fourth opening 11 are formed in the junction flow path-forming plate 33. The junction flow paths 7 and the fourth opening 11 pass through the junction flow path-forming plate 33 in the thickness direction of the junction flow path-forming plate 33. In a planar view, the fourth opening 11 is disposed in a position coinciding with the first opening 8 and the third opening 10. The fourth opening 11 communicates with the first opening 8 and the third opening 10. The junction flow paths 7 will be described in detail later.

The second flow path-forming plate 34 is a plate that forms a second flow path 6 between the bottom plate 35 and the junction flow path-forming plate 33. In the second flow path-forming plate 34, a second outer peripheral wall 20, a plurality of second partition walls 17, and a plurality of second fins 18 are formed. The second outer peripheral wall 20, the second partition walls 17, and the second fins 18 will be described in detail later. In the second flow path-forming plate 34, a plurality of second divided regions 61 and a second common header region 62 are formed. The second divided regions 61 and the second common header region 62 pass through the second flow path-forming plate 34 in the thickness direction of the second flow path-forming plate 34. The second divided regions 61 and the second common header region 62 will be described in detail later.

The bottom plate 35, which is a third plate, is disposed opposite the heat transfer plate 31 with the first flow path-forming plate 32, the junction flow path-forming plate 33, and the second flow path-forming plate 34 interposed therebetween. The bottom plate 35 is a flat plate without openings.

Next, the coolant flow path 4 will be described in detail. The coolant flow path 4 includes the first opening 8, the second opening 9, the third opening 10, the fourth opening 11, the first flow path 5, the second flow path 6, and the plurality of junction flow paths 7. The first flow path 5 is formed by the heat transfer plate 31, the junction flow path-forming plate 33, and the first outer peripheral wall 15. The second flow path 6 is formed by the junction flow path-forming plate 33, the bottom plate 35, and the second outer peripheral wall 20. The plurality of junction flow paths 7 connect the first flow path 5 and the second flow path 6.

The first opening 8, the third opening 10, and the fourth opening 11 serve as an inlet flow path for causing the coolant to flow into the heat sink 3. A pipe (not illustrated) for supplying the coolant into the heat sink 3 is connected to the first opening 8. A pipe (not illustrated) for discharging the coolant to the outside of the heat sink 3 is connected to the second opening 9. The first opening 8 and the second opening 9 are connected to a reservoir tank (not illustrated) via the pipes. By driving a pump (not illustrated), the coolant is supplied from the reservoir tank to the first opening 8 through the pipe.

Figure 2:
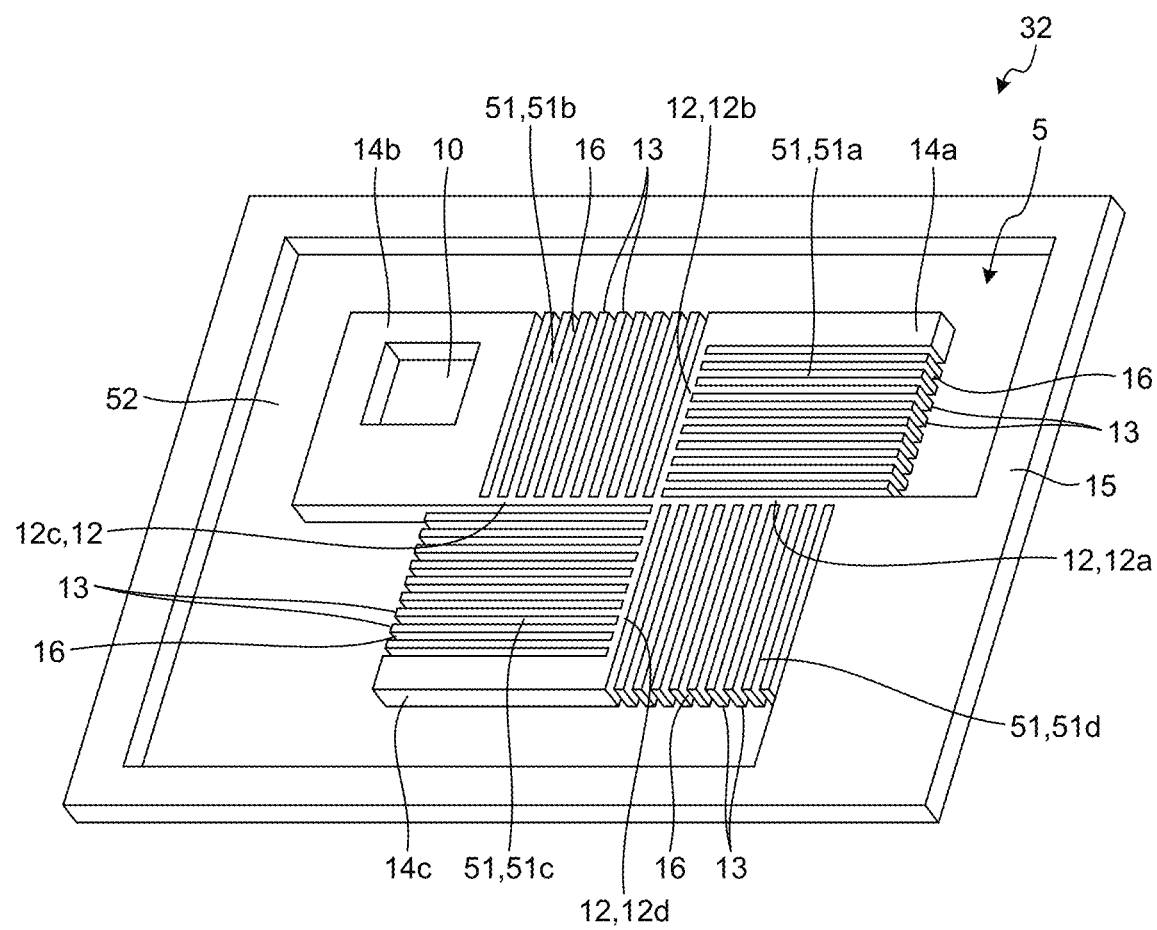
FIG. 2 is a perspective view illustrating a first flow path-forming plate according to the first embodiment.

FIG. 2 is a perspective view illustrating the first flow path-forming plate 32 according to the first embodiment. In the first flow path 5, the plurality of first divided regions 51 and the first common header region 52 are formed. The plurality of first divided regions 51 are separated by the first partition walls 12. In the first embodiment, part of the first flow path 5 is divided into four first divided regions 51 by four first partition walls 12. In addition to serving the function of dividing part of the first flow path 5 into the plurality of first divided regions 51, the first partition walls 12 also serve as fins that transfer heat from the heat transfer plate 31 to the coolant. The four first partition walls 12 extend radially from a center point. The four first partition walls 12 are disposed at 90 degree intervals along a circumferential direction around the center point. When the four first partition walls 12 are distinguished, they are referred to as first partition walls 12a, 12b, 12c, and 12d. When the four first divided regions 51 are distinguished, they are referred to as first divided regions 51a, 51b, 51c, and 51d.

A first dividing wall 14a protruding to the opposite side of the first divided region 51b is formed at the distal end of the first partition wall 12b. The distal end of the first partition wall 12c is connected to the first dividing wall 14b adjacent to the first divided region 51b. A first dividing wall 14c protruding to the opposite side of the first divided region 51d is formed at the distal end of the first partition wall 12d. The distal end of the first partition wall 12a is connected to the first outer peripheral wall 15. A space partitioned off by the first partition walls 12a and 12b and the first dividing wall 14a is the first divided region 51a. A space partitioned off by the first partition walls 12b and 12c and the first dividing wall 14b is the first divided region 51b. A space partitioned off by the first partition walls 12c and 12d and the first dividing wall 14c is the first divided region 51c. A space partitioned off by the first partition walls 12a and 12d and the first outer peripheral wall 15 is the first divided region 51d.

The plurality of first fins 13 are disposed in each of the first divided regions 51. The plurality of first fins 13 are arranged by being spaced side by side in parallel. The first fins 13 in all the first divided regions 51 are installed at equal intervals. The first fins 13 are formed in a flat plate shape. The first fins 13 protrude from each of the first partition walls 12 toward the first divided regions 51. One end of each first fin 13 along the length direction is connected to the first partition wall 12. The other end of each first fin 13 along the length direction faces the first common header region 52. The first fins 13 disposed in the adjacent first divided regions 51 protrude from the different first partition walls 12. The lengthwise directions of the first fins 13 disposed in the adjacent first divided regions 51 are orthogonal to each other. First inter-fin flow paths 16 are formed between the adjacent first fins 13 and 13 and between the first fins 13 and the first partition walls 12 adjacent to each other. First inter-fin flow paths 16 are also formed between the first fin 13 and each of the first dividing walls 14a to 14c adjacent to each other and between the first fin 13 and the first outer peripheral wall 15 adjacent to each other.

The first common header region 52 is a region provided in such a manner to surround the plurality of first divided regions 51. The first common header region 52 communicates with the first inter-fin flow paths 16 in the first divided regions 51. As illustrated in FIG. 1, the first common header region 52 is arranged in a position coinciding with the second opening 9 in a planar view. The first common header region 52 communicates with the second opening 9.

Figure 3:
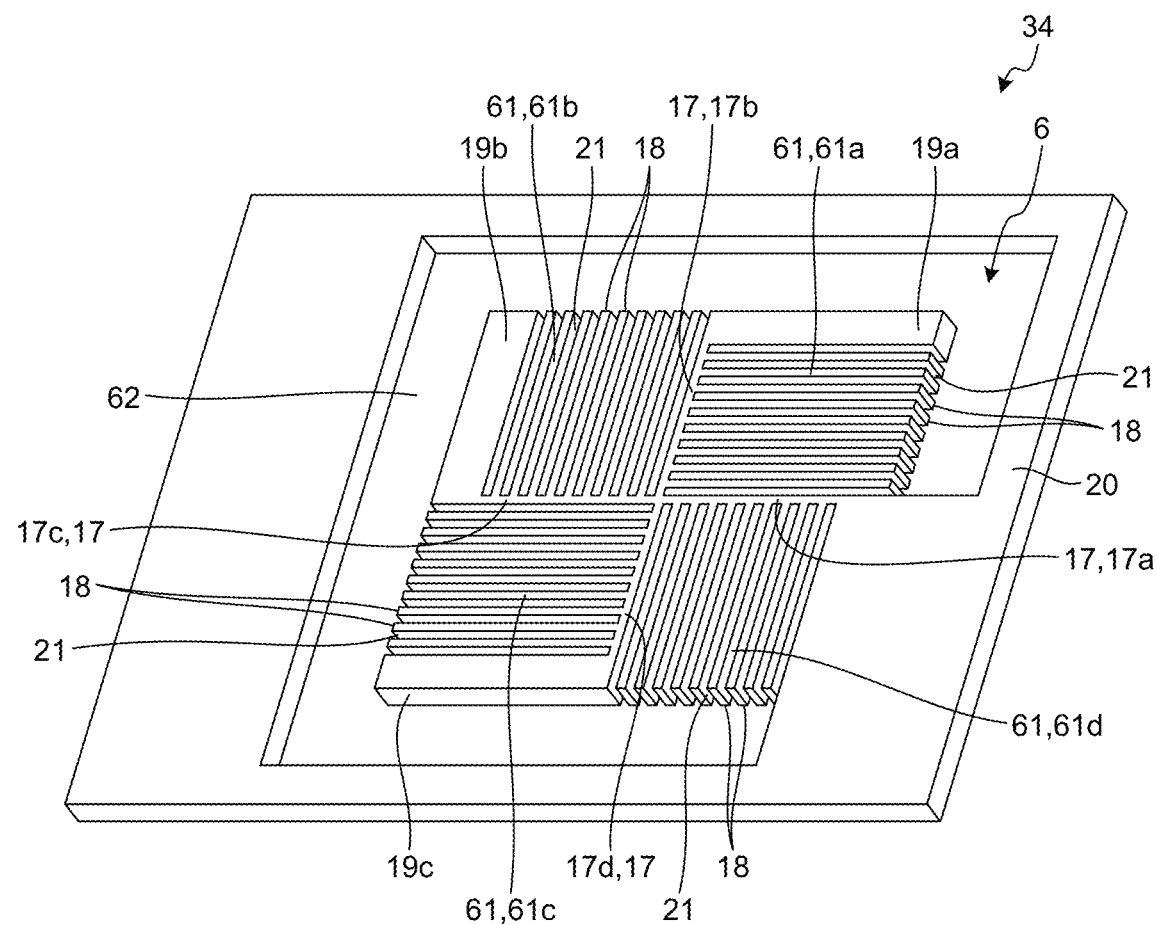
FIG. 3 is a perspective view illustrating a second flow path-forming plate according to the first embodiment.

FIG. 3 is a perspective view illustrating the second flow path-forming plate 34 according to the first embodiment. In the second flow path 6, the plurality of second divided regions 61 and the second common header region 62 are formed. The plurality of second divided regions 61 are separated by the second partition walls 17. In the first embodiment, part of the second flow path 6 is divided into four second divided regions 61 by four second partition walls 17. The four second partition walls 17 extend radially from a center point. The four second partition walls 17 are disposed at 90 degree intervals along a circumferential direction around the center point. When the four second partition walls 17 are distinguished, they are referred to as second partition walls 17a, 17b, 17c, and 17d. When the four second divided regions 61 are distinguished, they are referred to as second divided regions 61a, 61b, 61c, and 61d.

A second dividing wall 19a protruding to the opposite side of the second divided region 61b is formed at the distal end of the second partition wall 17b. The distal end of the second partition wall 17c is connected to a second dividing wall 19b that is adjacent to the second divided region 61b. A second dividing wall 19c protruding to the opposite side of the second divided region 61d is formed at the distal end of the second partition wall 17d. The distal end of the second partition wall 17a is connected to the second outer peripheral wall 20. A space partitioned off by the second partition walls 17a and 17b and the second dividing wall 19a is the second divided region 61a. A space partitioned off by the second partition walls 17b and 17c and the second dividing wall 19b is the second divided region 61b. A space partitioned off by the second partition walls 17c and 17d and the second dividing wall 19c is the second divided region 61c. A space partitioned off by the second partition walls 17a and 17d and the second outer peripheral wall 20 is the second divided region 61d.

The plurality of second fins 18 are disposed in each of the second divided regions 61. The plurality of second fins 18 are arranged by being spaced side by side in parallel. The second fins 18 in all the second divided regions 61 are installed at equal intervals. The second fins 18 are formed in a flat plate shape. The second fins 18 protrude from each of the second partition walls 17 toward the second divided regions 61. One end of each second fin 18 along the length direction is connected to the second partition wall 17. The other end of each second fin 18 along the length direction faces the second common header region 62. The second fins 18 disposed in the adjacent second divided regions 61 protrude from the different second partition walls 17. The lengthwise directions of the second fins 18 disposed in the adjacent second divided regions 61 are orthogonal to each other. Second inter-fin flow paths 21 are formed between the adjacent second fins 18 and 18 and between the second fins 18 and the second partition walls 17 adjacent to each other. Second inter-fin flow paths 21 are also formed between the second fin 18 and each of the second dividing walls 19a to 19c adjacent to each other, and between the second fin 18 and the second outer peripheral wall 20 adjacent to each other.

The second common header region 62 is a region provided in such a manner to surround the plurality of second divided regions 61. The second common header region 62 communicates with the second inter-fin flow paths 21 in the second divided regions 61. As illustrated in FIG. 1, the second common header region 62 is arranged in a position that coincides with the first opening 8, the third opening 10, and the fourth opening 11 in a planar view. The first opening 8, the third opening 10, the fourth opening 11, and the second common header region 62 communicate with each other.

Four junction flow paths 7 are disposed at 90 degree intervals along a circumferential direction around a center point. The four junction flow paths 7 are disposed at equal intervals. When the four junction flow paths 7 are distinguished, they are referred to as junction flow paths 7a, 7b, 7c, and 7d. The junction flow paths 7, which are not limited to a particular shape, are in an elongated rectangular shape in the first embodiment. The length directions of the adjacent junction flow paths 7 are orthogonal to each other. In a planar view, the first divided region 51a, the second divided region 61a, and the junction flow path 7a are disposed at a position that coincides with each other. The length direction of the first fins 13 in the first divided region 51a and the length direction of the second fins 18 in the second divided region 61a are parallel to each other. In a planar view, the first divided region 51b, the second divided region 61b, and the junction flow path 7b are disposed at a position that coincides with each other. The length direction of the first fins 13 in the first divided region 51b and the length direction of the second fins 18 in the second divided region 61b are parallel to each other. In a planar view, the first divided region 51c, the second divided region 61c, and the junction flow path 7c are disposed at a position that coincides with each other. The length direction of the first fins 13 in the first divided region 51c and the length direction of the second fins 18 in the second divided region 61c are parallel to each other. In a planar view, the first divided region 51d, the second divided region 61d, and the junction flow path 7d are disposed at a position that coincides with each other. The length direction of the first fins 13 in the first divided region 51d and the length direction of the second fins 18 in the second divided region 61d are parallel to each other.

Figure 4:
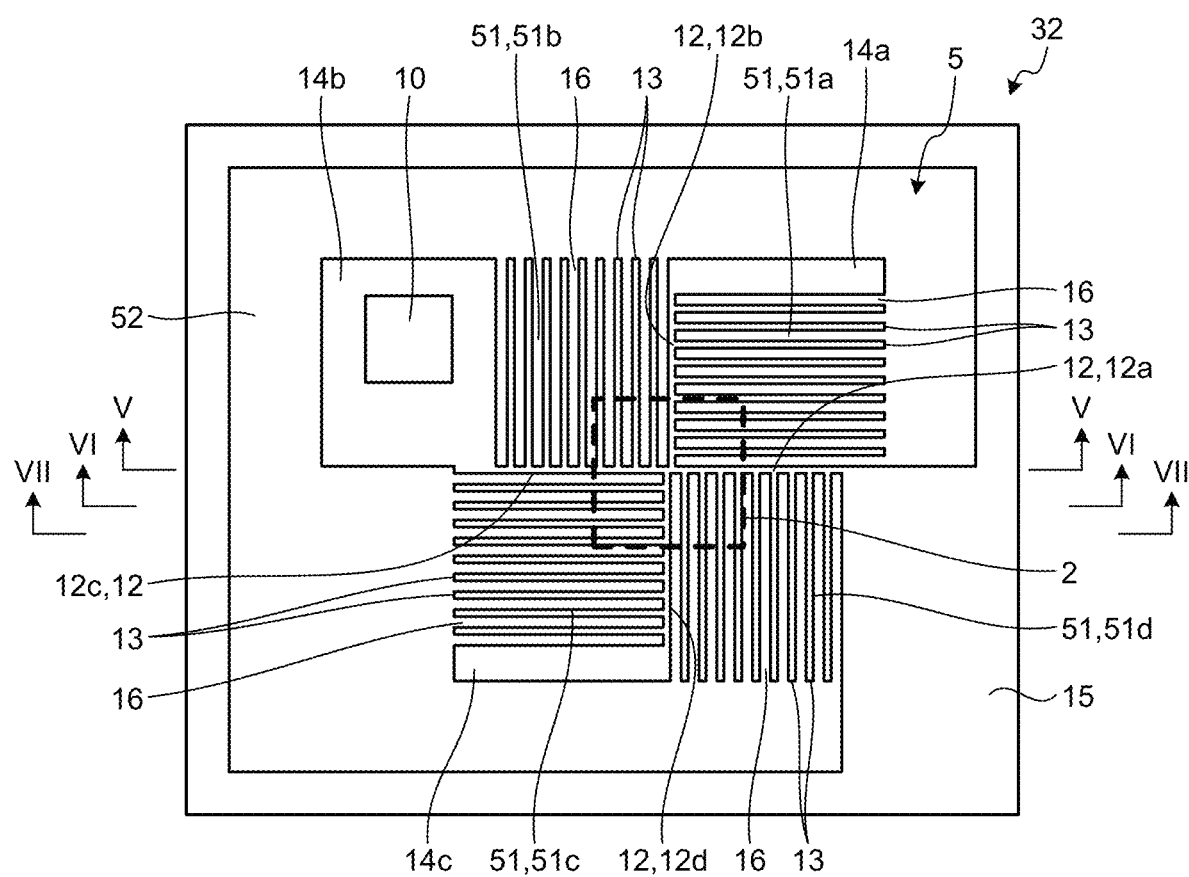
FIG. 4 is a plan view illustrating the first flow path-forming plate according to the first embodiment.
Figure 5:
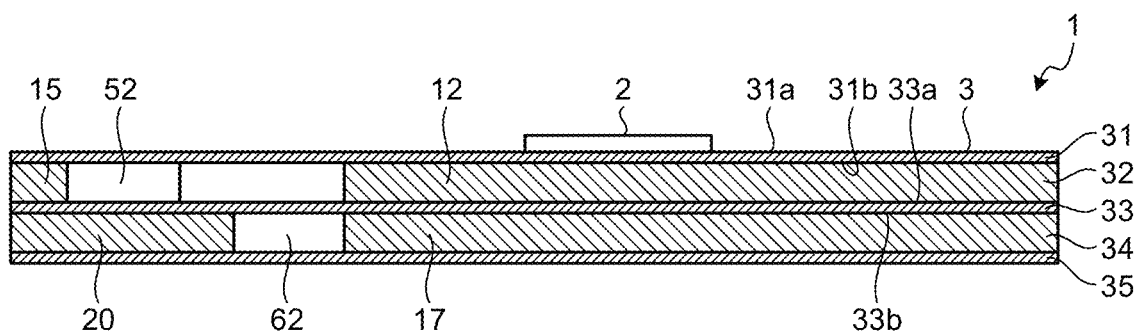
FIG. 5 is a cross-sectional view of the semiconductor module taken along line V-V illustrated in FIG. 4.
Figure 6:
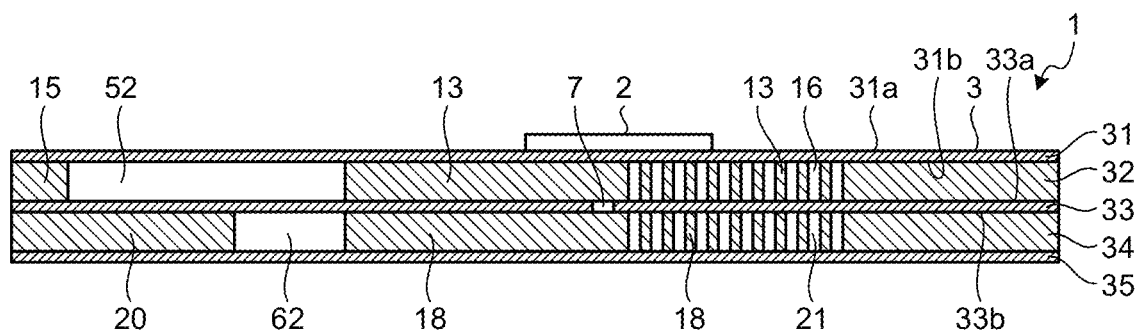
FIG. 6 is a cross-sectional view of the semiconductor module taken along line VI-VI illustrated in FIG. 4.
Figure 7:
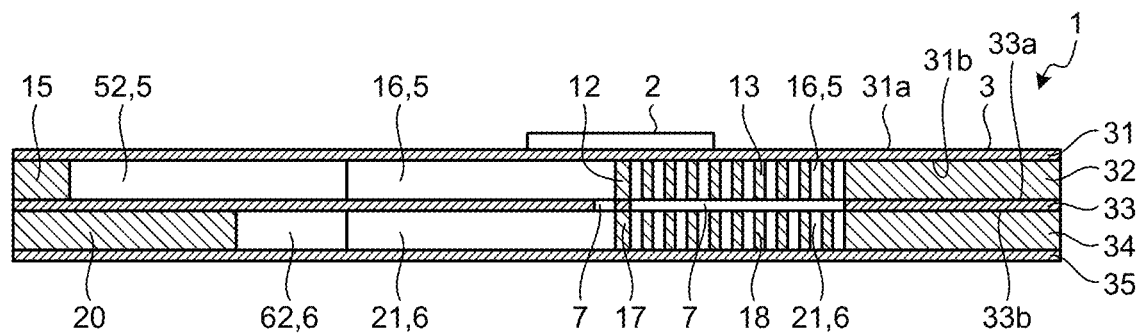
FIG. 7 is a cross-sectional view of the semiconductor module taken along line VII-VII illustrated in FIG. 4.

FIG. 4 is a plan view illustrating the first flow path-forming plate 32 according to the first embodiment. FIG. 5 is a cross-sectional view of the semiconductor module 1 taken along line V-V illustrated in FIG. 4. FIG. 6 is a cross-sectional view of the semiconductor module 1 taken along line VI-VI illustrated in FIG. 4. FIG. 7 is a cross-sectional view of the semiconductor module 1 taken along line VII-VII illustrated in FIG. 4. In FIG. 4, for explanatory convenience, the semiconductor device 2 is illustrated by a broken line. In FIG. 4, for explanatory convenience, only the first flow path-forming plate 32 of the heat sink 3 is illustrated, and the positions of the cross sections of the semiconductor module 1 illustrated in FIGS. 5 to 7 are indicated using the first flow path-forming plate 32. As illustrated in FIG. 5, the first partition walls 12 are provided in contact with the second surface 31b of the heat transfer plate 31 and the third surface 33a of the junction flow path-forming plate 33. The first outer peripheral wall 15 is provided in contact with the second surface 31b of the heat transfer plate 31 and the third surface 33a of the junction flow path-forming plate 33. The second partition walls 17 are provided in contact with the fourth surface 33b of the junction flow path-forming plate 33 and the bottom plate 35. The second outer peripheral wall 20 is provided in contact with the fourth surface 33b of the junction flow path-forming plate 33 and the bottom plate 35.

As illustrated in FIGS. 6 and 7, the first fins 13 are provided in contact with the second surface 31b of the heat transfer plate 31 and the third surface 33a of the junction flow path-forming plate 33. The second fins 18 are provided in contact with the fourth surface 33b of the junction flow path-forming plate 33 and the bottom plate 35. As illustrated in FIG. 7, the first inter-fin flow paths 16 and the second inter-fin flow paths 21 communicate with each other through the junction flow paths 7. The width of the first partition walls 12 and the width of the second partition walls 17 are equal. The width of the first fins 13 and the width of the second fins 18 are equal. The installation interval between the first fins 13 is equal to the installation interval between the second fins 18. When the reduction of the pressure loss of the coolant, the improvement of the effect of cooling by the coolant, and the suppression of corrosion of the first fins 13 etc. are considered, it is preferable to approximately equalize the average flow velocity of the coolant flowing through the junction flow paths 7 and the average flow velocity of the coolant flowing through the first inter-fin flow paths 16. For example, when the opening width of the junction flow paths 7 is set to about half the height of the first fins 13, the average flow velocity of the coolant flowing through the junction flow paths 7 and the average flow velocity of the coolant flowing through the first inter-fin flow paths 16 can be approximately equalized.

Figure 8:
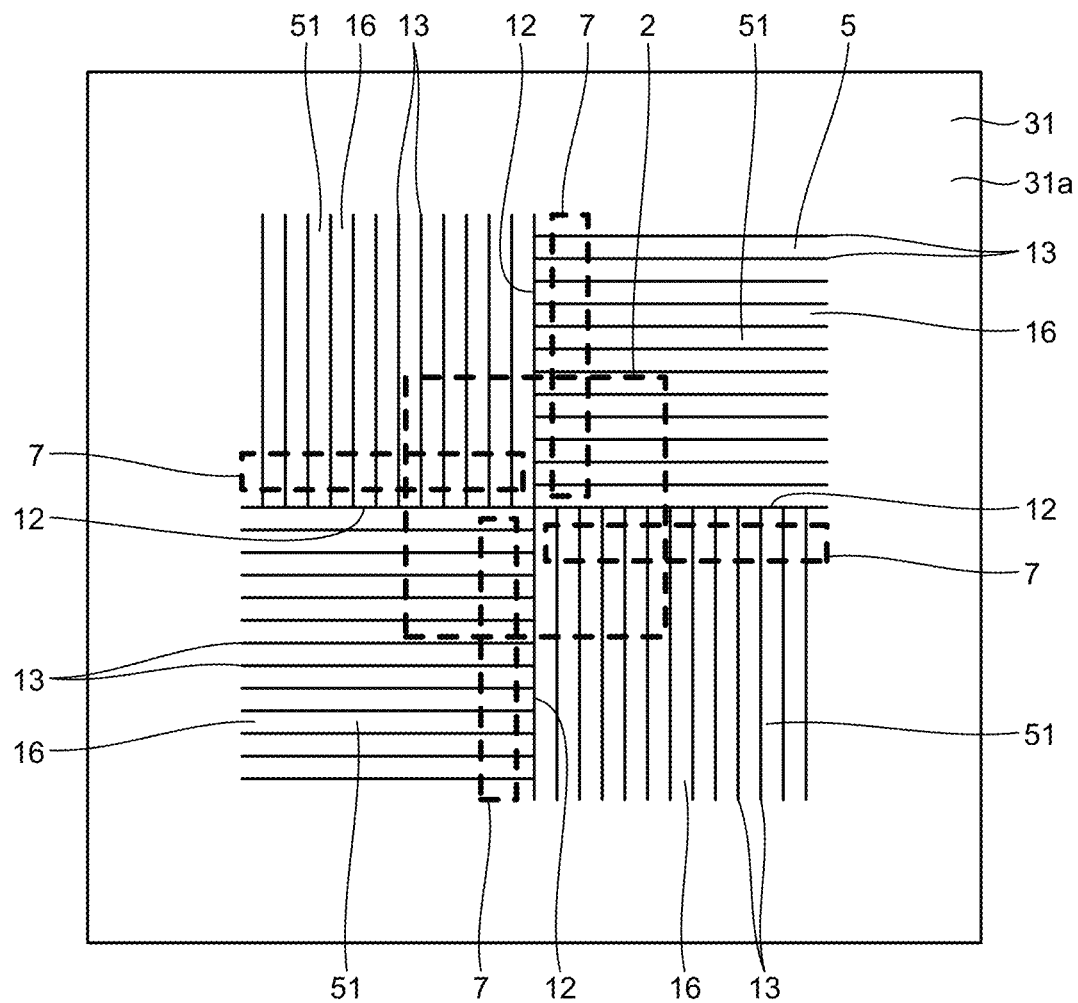
FIG. 8 is a plan view illustrating first partition walls, first fins, and junction flow paths projected onto a first surface.

FIG. 8 is a plan view illustrating the first partition walls 12, the first fins 13, and the junction flow paths 7 projected onto the first surface 31a. In FIG. 8, for ease of explanation, the first partition walls 12 and the first fins 13 are illustrated by solid lines, and the junction flow paths 7 and the semiconductor device 2 are illustrated by broken lines. In FIG. 8, for ease of explanation, the heat transfer plate 31 is drawn extremely small. A position where a part of the first partition walls 12, part of the first fins 13, and part of the first inter-fin flow paths 16 are projected onto the first surface 31*a* coincides with the semiconductor device 2. In the first embodiment, the center point of the four first partition walls 12 coincides with the central part of the semiconductor device 2. A position where a part of the first partition walls 12 are projected onto the first surface 31*a* coincide with the central part of the semiconductor device 2 and with the periphery of the central part of the semiconductor device 2. A position where a part of the first fins 13 and a part of the first inter-fin flow paths 16 are projected onto the first surface 31*a* coincides with the periphery of the central part of the semiconductor device 2. Although a position where a part of the first partition walls 12 are projected onto the first surface 31*a* coincides with the central part of the semiconductor device 2 in the first embodiment, a position where a part of the first fins 13 are projected onto the first surface 31*a* may coincide with the central part of the semiconductor device 2.

When the junction flow paths 7, the first divided regions 51, and the first fins 13 are projected onto the first surface 31*a*, each junction flow path 7 is placed on the corresponding one of the plurality of first divided regions 51 and is formed elongatedly across the plurality of first fins 13. The length direction of each junction flow path 7 is orthogonal to the length direction of the first fins 13. Each junction flow path 7 is placed on root portions of the first fins 13 connected to the first partition wall 12.

As described above, the coolant flow path 4 is formed hierarchically to include: the first flow path 5 closest to the first surface 31*a* on which the semiconductor device 2 is disposed; the second flow path 6 formed farther away from the first surface 31*a* than the first flow path 5 in the direction of the normal to the first surface 31*a*; and the junction flow paths 7 placed between the first flow path 5 and the second flow path 6 and connecting the first flow path 5 and the second flow path 6. The first flow path 5 has as its inner surfaces the second surface 31*b* on the first surface 31*a* side and the third surface 33*a* facing the second surface 31*b*. In the first flow path 5, the plurality of first divided regions 51 are formed, and the plurality of first divided regions 51 are separated by the first partition walls 12 provided between the second surface 31*b* and the third surface 33*a*. The first divided regions 51 include the plurality of first fins 13 arranged by being spaced side by side and formed to extend from the first partition walls 12. A position where at least part of the first partition walls 12 are projected onto the first surface 31*a* or a position where at least part of the first fins 13 are projected onto the first surface 31*a* coincide with the central part of a region of the first surface 31*a* where the semiconductor device 2 is installed. When the junction flow paths 7, the first divided regions 51, and the first fins 13 are projected onto the first surface 31*a*, at least one of the junction flow paths 7 is placed on each of the plurality of first divided regions 51 and is formed elongatedly across the plurality of first fins 13 along the first partition wall 12. In the heat sink 3, the coolant flows between the first flow path 5 and the second flow path 6 through the junction flow paths 7.

Next, the flow of the coolant will be described with reference to FIG. 1. The coolant that has flowed from the first opening 8 into the heat sink 3 flows into the second common header region 62 through the third opening 10 and the fourth opening 11. Then, the coolant flows from the second common header region 62 into the second inter-fin flow paths 21 in the second divided regions 61. Then, the coolant flows from the second inter-fin flow paths 21 into the first inter-fin flow paths 16 in the first divided regions 51 through the junction flow paths 7. At this time, the coolant in the second inter-fin flow paths 21 in the second divided region 61*a* flows into the first inter-fin flow paths 16 in the first divided region 51*a* through the junction flow path 7*a*. The coolant in the second inter-fin flow paths 21 in the second divided region 61*b* flows into the first inter-fin flow paths 16 in the first divided region 51*b* through the junction flow path 7*b*. The coolant in the second inter-fin flow paths 21 in the second divided region 61*c* flows into the first inter-fin flow paths 16 in the first divided region 51*c* through the junction flow path 7*c*. The coolant in the second inter-fin flow paths 21 in the second divided region 61*d* flows into the first inter-fin flow paths 16 in the first divided region 51*d* through the junction flow path 7*d*. After that, the coolant flows from the first inter-fin flow paths 16 in the first divided regions 51 into the first common header region 52. Then, the coolant flows from the first common header region 52 to the outside of the heat sink 3 through the second opening 9.

Next, the functions and effects of the semiconductor module 1 according to the first embodiment will be described.

As illustrated in FIG. 7, heat generated in the semiconductor device 2 is transferred to the heat transfer plate 31. The heat transferred to the heat transfer plate 31 is transferred to the first partition walls 12 and the first fins 13. When the coolant flows in the first flow path 5, heat exchange is performed between the heat transfer plate 31 and the coolant, between the first partition walls 12 and the coolant, and between the first fins 13 and the coolant. That is, the coolant absorbs the heat transferred to the heat transfer plate 31, the first partition walls 12, and the first fins 13. Consequently, the semiconductor device 2 is cooled by the coolant via the heat transfer plate 31, the first partition walls 12, and the first fins 13. As illustrated in FIG. 8, in the first embodiment, a position where part of the first partition walls 12 is projected onto the first surface 31*a* coincides with the central part of the semiconductor device 2. A position where part of the first fins 13 is projected onto the first surface 31*a* coincides with the periphery of the central part of the semiconductor device 2. Thus, heat generated in the central part of the semiconductor device 2 is easily transferred to the first partition walls 12 and the first fins 13 through the heat transfer plate 31. Since the heat transferred to the first partition walls 12 and the first fins 13 is absorbed by the coolant flowing through the first inter-fin flow paths 16, the cooling effect on the central part of the semiconductor device 2 is enhanced.

Figure 9:
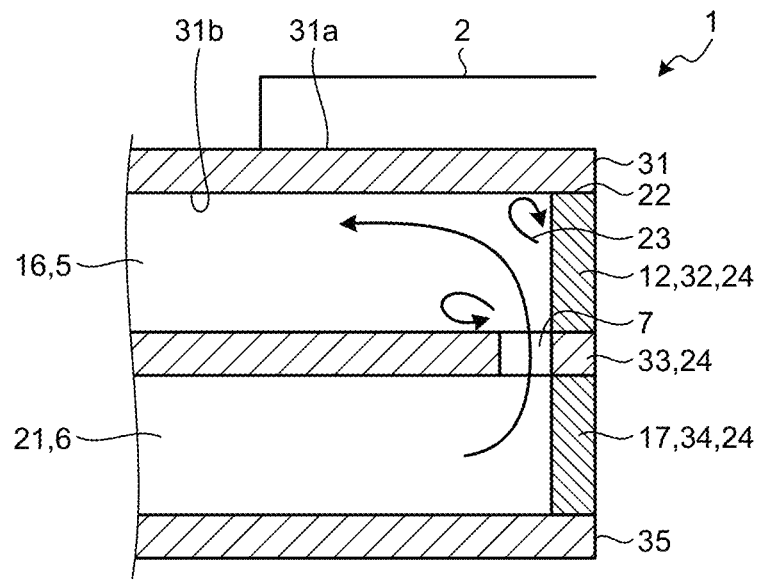
FIG. 9 is a partially enlarged cross-sectional view of the semiconductor module illustrated in FIG. 7.

With reference to FIGS. 1 and 9, the cooling effect by the coolant on the semiconductor device 2 will be described. FIG. 9 is a partially enlarged cross-sectional view of the semiconductor module 1 illustrated in FIG. 7. In general, the temperature of heat generated in the semiconductor device 2 is higher toward the central part of the semiconductor device 2. Consequently, unevenness occurs in the distributions of temperatures of the semiconductor device 2 and the heat transfer plate 31. In the first embodiment, when the coolant flows in from the first opening 8 illustrated in FIG. 1, the coolant that has flowed from the second inter-fin flow path 21 into the first inter-fin flow path 16 through the junction flow path 7 illustrated in FIG. 9 strikes the second surface 31*b* of the heat transfer plate 31 at a position close to the central part of the semiconductor device 2. Consequently, the temperature of the central part of the semiconductor device 2 can be lowered, and the unevenness of the temperature distribution in the semiconductor device 2 can be reduced. As illustrated in FIG. 9, when the coolant flows into the first inter-fin flow path 16, a vortex 23 is generated near a joint 22 between the heat transfer plate 31 and the first partition wall 12 in the first inter-fin flow path 16, and coolant stagnation occurs in the first inter-fin flow path 16. In places where the coolant stagnates, the cooling effect by the coolant on the heat transfer plate 31 decreases. In this regard, the first embodiment, in which the coolant strikes the second surface 31b of the heat transfer plate 31 near the stagnant places, can suppress the temperature rise of the heat transfer plate 31 due to the coolant stagnation.

As illustrated in FIG. 8, in the first embodiment, when the junction flow paths 7, the first divided regions 51, and the first fins 13 are projected onto the first surface 31a, the junction flow paths 7 are formed elongatedly across the plurality of first fins 13. Thus, the flow path area of the junction flow paths 7 is reduced, and the flow velocity of the coolant increases when passing through the junction flow paths 7. As a result, the coolant increased in flow velocity strikes the second surface 31b of the heat transfer plate 31 at positions close to the central part of the semiconductor device 2, so that the temperature of the central part of the semiconductor device 2 can be further reduced, and the unevenness of the temperature distribution in the semiconductor device 2 can be reduced.

Here, assume that a wall formed by stacking the first partition wall 12, the second partition wall 17, and the junction flow path-forming plate 33 illustrated in FIG. 9 is a single central partition wall 24. The junction flow path 7 is disposed adjacent to an intermediate portion of the central partition wall 24 in the height direction. This can change the flow of the coolant from the second inter-fin flow path 21 toward the first inter-fin flow path 16 in a direction perpendicular to the heat transfer plate 31 at a position as close as possible to the heat transfer plate 31. Thus, the coolant that has passed through the junction flow path 7 strikes the second surface 31b of the heat transfer plate 31 nearly perpendicularly to the heat transfer plate 31. This can reduce the amount of generation of the vortex 23. Consequently, the temperature of the central part of the semiconductor device 2 can be further lowered, and the unevenness of the temperature distribution in the semiconductor device 2 can be reduced.

Figure 10:
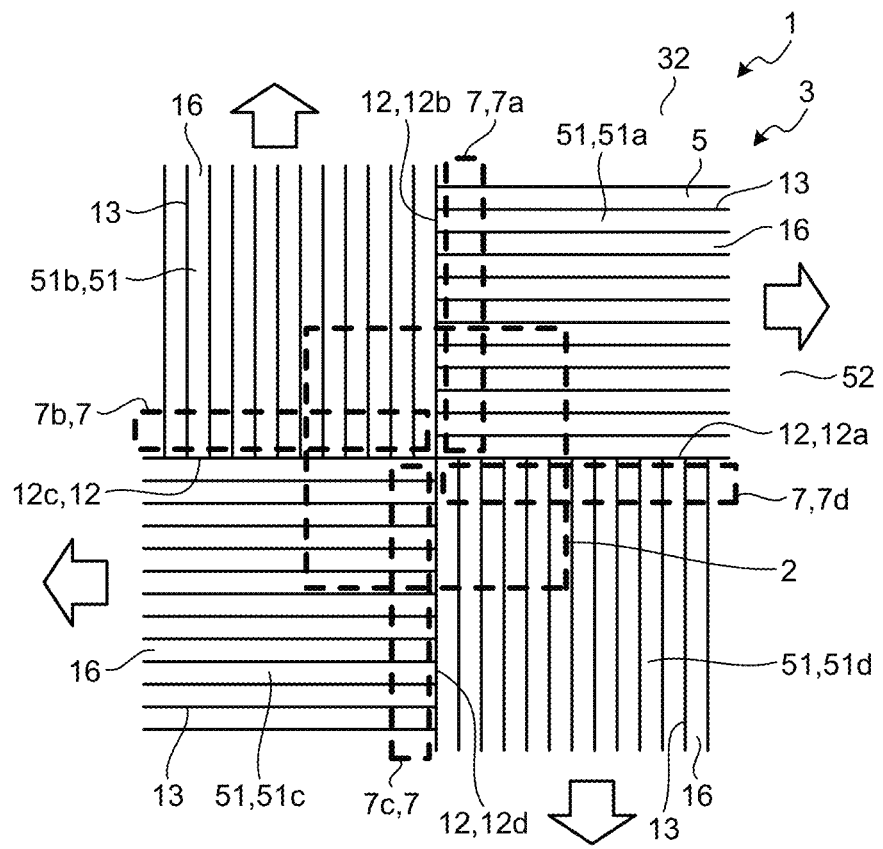
FIG. 10 is an explanatory diagram for explaining the flow of a coolant in a first flow path of a heat sink according to the first embodiment.

The functions and effects of the semiconductor module 1 according to the first embodiment will be further described with reference to FIG. 10. FIG. 10 is an explanatory diagram for explaining the flow of the coolant in the first flow path 5 of the heat sink 3 according to the first embodiment.

As illustrated in FIG. 10, in the heat sink 3 according to the first embodiment, the first fins 13 disposed in the adjacent first divided regions 51 protrude from the different first partition walls 12. The length directions of the first fins 13 disposed in the adjacent first divided regions 51 are orthogonal to each other. The length directions of the adjacent junction flow paths 7 are orthogonal to each other. The four junction flow paths 7 are disposed at equal intervals. The coolant in the first inter-fin flow paths 16 in the first divided region 51a flows from the left to the right of the sheet of FIG. 10. The coolant in the first inter-fin flow paths 16 in the first divided region 51b flows from the bottom to the top of the sheet of FIG. 10. The coolant in the first inter-fin flow paths 16 in the first divided region 51c flows from the right to the left of the sheet of FIG. 10. The coolant in the first inter-fin flow paths 16 in the first divided region 51d flows from the top to the bottom of the sheet of FIG. 10. That is, in the first embodiment, the coolant flows evenly to the top, to the bottom, to the left, and to the right of the sheet of FIG. 10 in the first inter-fin flow paths 16, thus being able to reduce the unevenness of the temperature distribution in the semiconductor device 2. In addition, since the four junction flow paths 7 are disposed at equal intervals, the coolant provides an even cooling effect on the heat transfer plate 31 when the coolant strikes the second surface 31b of the heat transfer plate 31 at positions close to the central part of the semiconductor device 2 as illustrated in FIG. 9.

As illustrated in FIG. 10, in the first embodiment, the junction flow paths 7 are placed on the root portions of the first fins 13 connected to the first partition walls 12. Thus, the coolant that has flowed from the junction flow paths 7 into the first inter-fin flow paths 16 flows from the vicinities of the first partition walls 12 toward the first common header region 52. That is, part of the coolant flowing through the first inter-fin flow paths 16 first comes into contact with portions of the heat transfer plate 31 close to the central part of the semiconductor device 2, and then comes into contact with portions of the heat transfer plate 31 close to the outer peripheral part of the semiconductor device 2. Consequently, more heat in the portions of the heat transfer plate 31 close to the central part of the semiconductor device 2 can be absorbed by the coolant, so that the unevenness of the temperature distribution in the semiconductor device 2 can be reduced. The coolant flowing through the first inter-fin flow paths 16 absorbs more heat toward the outer periphery of the first flow path-forming plate 32, thus increasing in temperature. Consequently, the cooling effect by the coolant on the outer peripheral part of the semiconductor device 2 is relatively lower than the cooling effect by the coolant on the central part of the semiconductor device 2, so that the unevenness of the temperature distribution in the semiconductor device 2 can be reduced.

In the first embodiment, since the cooling effect on the central part of the semiconductor device 2 is higher than that on the outer peripheral part of the semiconductor device 2, even if the length of the first inter-fin flow paths 16 is shortened, for example, even if the length of the first inter-fin flow paths 16 is halved, the cooling effect by the coolant on the central part of the semiconductor device 2 can be sufficiently exerted. Further, by shortening the length of the first inter-fin flow paths 16, the pressure loss of the coolant in the first inter-fin flow paths 16 can be reduced.

As illustrated in FIG. 8, in the first embodiment, the four first divided regions 51 separated by the four first partition walls 12 are formed in the first flow path 5. A position where part of the first divided regions 51 are projected onto the first surface 31a coincide the semiconductor device 2. When the junction flow paths 7, the first divided regions 51, and the first fins 13 are projected onto the first surface 31a, each junction flow path 7 coincides with the corresponding one of the plurality of first divided regions 51. Consequently, the coolant flows from the junction flow paths 7 into the first divided regions 51, and the coolant strikes the second surface 31b of the heat transfer plate 31 in the first divided regions 51. This increases the number of points where the coolant strikes the second surface 31b of the heat transfer plate 31, enhancing the cooling effect by the coolant on the semiconductor device 2. Experiments conducted by the present inventors have revealed that when part of the first flow path 5 is divided into the plurality of first divided regions 51, the cooling effect on the semiconductor device 2 by the coolant is enhanced as compared with a case where straight fins are arranged without providing the first partition walls 12, that is, a case where part of the first flow path 5 is not divided into the plurality of first divided regions 51. The experimental results are based on the condition that the average flow velocity of the coolant flowing through the first inter-fin flow paths 16 is the same between the case where part of the first flow path 5 is divided into the plurality of first divided regions 51 and the case where part of the first flow path 5 is not divided into the plurality of first divided regions 51.

As illustrated in FIG. 2, in the first embodiment, the first common header region 52 provided around the first divided regions 51 is formed in the first flow path 5, and the first common header region 52 communicates with the first inter-fin flow paths 16 in the first divided regions 51. This allows all the first inter-fin flow paths 16 in the first divided regions 51 and the first common header region 52 to be disposed in the same layer, thus thinning of the entire heat sink 3 and reducing of the size of the heat sink 3 can be achieved. As illustrated in FIG. 3, in the first embodiment, the second common header region 62, which is provided so as to surround the second divided regions 61, is formed in the second flow path 6, and the second common header region 62 communicates with the second inter-fin flow paths 21 in the second divided regions 61. This allows all the second inter-fin flow paths 21 in the second divided regions 61 and the second common header region 62 to be disposed in the same layer, thus thinning the entire heat sink 3 and reducing the size of the heat sink 3 can be achieved.

The heat sink 3 and the semiconductor device 2 have different thermal expansion coefficients and Young's moduli. Thus, heat generated at the time of joining the heat sink 3 and the semiconductor device 2 increases warpage, stress, and distortion that occur between the heat sink 3 and the semiconductor device 2. This causes adverse effects such as the destruction of the semiconductor device 2 and a poor joint between the heat sink 3 and the semiconductor device 2. When the entire heat sink 3 can be made thin as in the first, warpage, stress, and strain that occur between the heat sink 3 and the semiconductor device 2 can be reduced, and the occurrence of adverse effects as described above can be suppressed.

The larger the number of the first divided regions 51 illustrated in FIG. 1, the higher the cooling effect on the semiconductor device 2. On the other hand, the larger the number of the first divided regions 51, the higher the production cost of the heat sink 3. In general, the heat sink 3 including the coolant flow path 4 is produced by joining and cutting a plurality of members. As the number of the first divided regions 51 increases, the number of junctions and the number of cutting points increase, thus increasing the production cost of the heat sink 3. Therefore, when part of the first flow path 5 is divided into the four first divided regions 51 as in the first embodiment, both the improvement of the cooling effect on the semiconductor device 2 by the coolant and the suppression of the production cost increase of the heat sink 3 can be achieved in a balanced manner.

As illustrated in FIG. 1, in the first embodiment, the first fins 13 are formed in a flat plate shape, and the plurality of first fins 13 are arranged side by side in parallel to each other. Consequently, the first inter-fin flow paths 16 are easily designed and produced. In addition, in the first embodiment, the second fins 18 are formed in a flat plate shape, and the plurality of second fins 18 are arranged side by side in parallel to each other. Consequently, the second inter-fin flow paths 21 are easily designed and produced.

The object to be cooled is not limited to the semiconductor device 2 as long as it is an electronic device that generates heat, and may be, for example, a capacitor. The first embodiment uses diffusion bonding as a method of joining each of the plates 31 to 35, but the joining of each of the plates 31 to 35 is not limited to a particular method, but for example, brazing may be used. Each of the heat transfer plate 31, the first flow path-forming plate 32, the junction flow path-forming plate 33, and the second flow path-forming plate 34 is produced by performing processing to form openings in a flat plate. Processing methods for forming openings include blanking, cutting, wire cutting, and etching. For a method of producing the heat sink 3, for example, a production method disclosed in Japanese Patent Application Laid-open No. 2007-205694 etc. may be used. That is, by stacking and joining a large number of thin plates, the heat sink 3 may be produced. When the heat sink 3 is produced in this way, for example, each of the first flow path-forming plate 32, the junction flow path-forming plate 33, and the second flow path-forming plate 34 is formed by a plurality of thin plates. In the first embodiment, the heat sink 3 is formed of the plurality of plates 31 to 35, but the heat sink 3 may be integrally formed using a 3D printer or the like. When the heat sink 3 is integrally formed, the members are not actually separated, but a region having the first surface 31a and the second surface 31b is regarded as the first plate. When the heat sink 3 is integrally formed, a region having the third surface 33a and the fourth surface 33b is regarded as the second plate. When the heat sink 3 is integrally formed, a region that forms the second flow paths 6 with the second plate is regarded as the third plate. In the first embodiment, the four first divided regions 51 are provided, but a plurality of first divided regions 51 other than four may be provided. The numbers of the second divided regions 61 and the junction flow paths 7 may be appropriately changed according to the number of the first divided regions 51. In the first embodiment, the plurality of first fins 13 are arranged side by side in parallel, but may not be arranged side by side in parallel. In the first embodiment, the plurality of second fins 18 are arranged side by side in parallel, but may not be arranged side by side in parallel. In the first embodiment, the heat sink 3 includes the second flow path-forming plate 34 and the bottom plate 35, and the coolant flow path 4 includes the second flow path 6 and the plurality of junction flow paths 7. However, the second flow path-forming plate 34 and the bottom plate 35 may be omitted so that the coolant flow path 4 does not include the second flow path 6 and the plurality of junction flow paths 7. In this configuration, the junction flow path-forming plate 33 is made a flat plate without openings like the bottom plate 35 according to the first embodiment. Further, the third opening 10 of the first flow path-forming plate 32 is omitted. The first opening 8 is created at a position that coincides with the first divided regions 51 in a planar view. For example, a first opening 8 may be created at a position that coincides with the corresponding one of the plurality of first divided regions 51. In the first embodiment, a single junction flow path 7 is arranged at a position that coincides with the corresponding one of the plurality of first divided regions 51, but two or more may be placed there. A single junction flow path 7 may be formed in the junction flow path-forming plate 33, and the single junction flow path 7 may be arranged at a position that coincides with all the first divided regions 51. In the first embodiment, the junction flow paths 7 are placed on the root portions of the first fins 13 connected to the first partition walls 12. However, the positions of the junction flow paths 7 relative to the first fins 13 may be appropriately changed as long as the junction flow paths 7 are placed at positions that coincide with the first fins 13.

Figure 11:
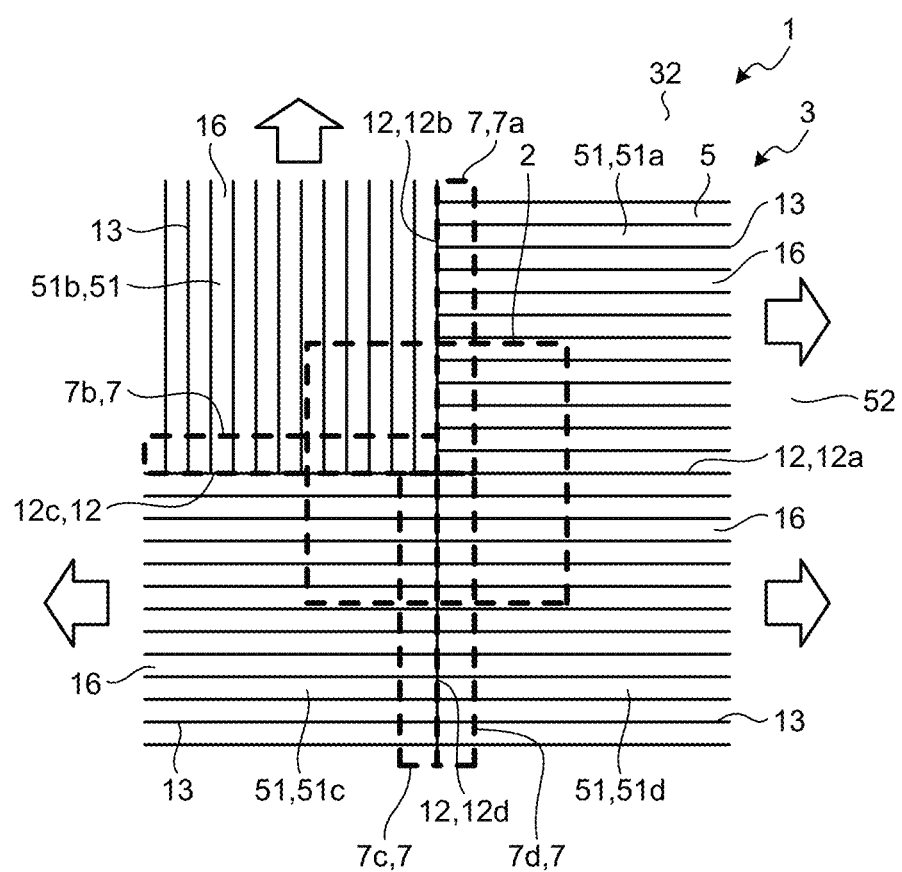
FIG. 11 is a diagram illustrating the heat sink of the semiconductor module according to a first modification of the first embodiment, and an explanatory diagram for explaining the flow of the coolant in the first flow path of the heat sink.

Next, the semiconductor module 1 according to a first modification of the first embodiment will be described with reference to FIG. 11. FIG. 11 is a diagram illustrating the heat sink 3 of the semiconductor module 1 according to the first modification of the first embodiment, and is an explanatory diagram for explaining the flow of the coolant in the first flow path 5 of the heat sink 3. In the first modification, the same reference numerals are assigned to portions corresponding to those in the above-described first embodiment to omit explanation. The first modification is different from the first embodiment in the flow of the coolant in the first flow path 5.

As illustrated in FIG. 11, in the heat sink 3 according to the first modification, part of the first flow path 5 is divided into the four first divided regions 51 by the four first partition walls 12. The first fins 13 disposed in the adjacent first divided regions 51c and 51d do not protrude from the different first partition walls 12. That is, the first fins 13 disposed in the adjacent first divided regions 51c and 51d protrude from the same first partition wall 12d in opposite directions. The length directions of the first fins 13 disposed in the first divided regions 51a, 51c, and 51d are parallel to each other. When the junction flow paths 7 are placed on the root portions of the first fins 13 connected to the first partition walls 12, the three junction flow paths 7a, 7c, and 7d are parallel to each other. The four junction flow paths 7 are disposed at unequal intervals. The coolant in the first inter-fin flow paths 16 in the first divided regions 51a and 51d flows from the left to the right of the sheet of FIG. 11. The coolant in the first inter-fin flow paths 16 in the first divided region 51b flows from the bottom to the top of the sheet of FIG. 11. The coolant in the first inter-fin flow paths 16 in the first divided region 51c flows from the right to the left of the sheet of FIG. 11. In the first modification, the positions of part of the first partition walls 12 when projected onto the first surface 31a (not illustrated) also coincide with the central part of the semiconductor device 2. Positions of part of the first fins 13 when projected onto the first surface 31a coincide with the periphery of the central part of the semiconductor device 2. Thus, heat generated in the central part of the semiconductor device 2 is easily transferred to the first partition walls 12 and the first fins 13 through the heat transfer plate 31. Since the heat transferred to the first partition walls 12 and the first fins 13 is absorbed by the coolant flowing through the first inter-fin flow paths 16, the cooling effect on the central part of the semiconductor device 2 is enhanced.

Figure 12:
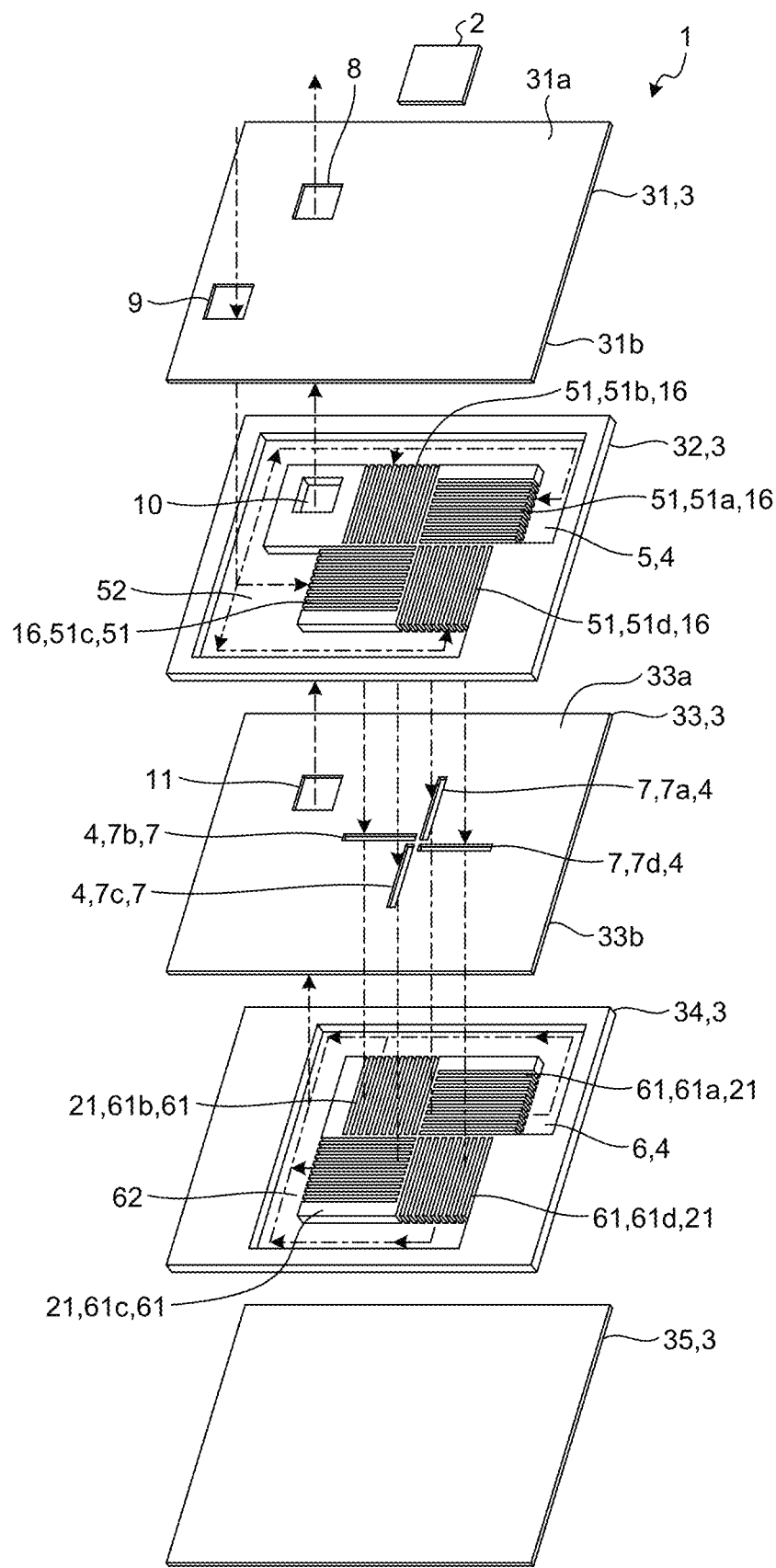
FIG. 12 is an exploded perspective view illustrating the semiconductor module according to a second modification of the first embodiment.
Figure 13:
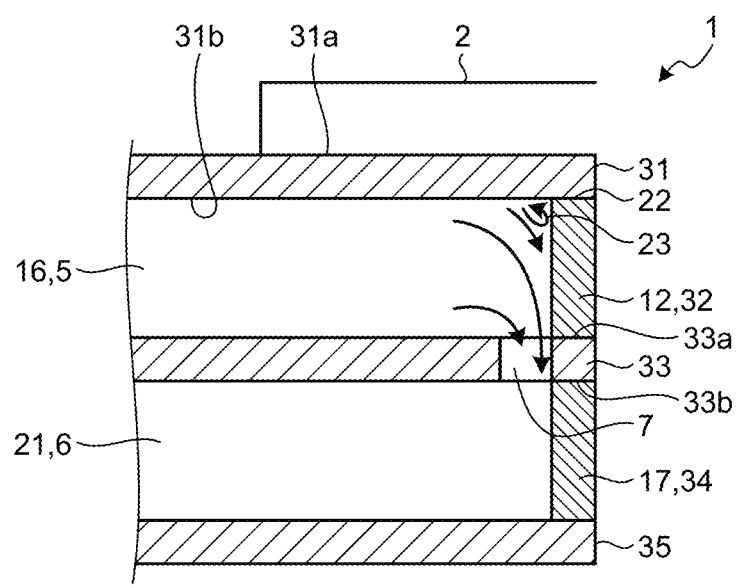
FIG. 13 is a partially enlarged cross-sectional view of the semiconductor module according to the second modification of the first embodiment.

Next, the semiconductor module 1 according to a second modification of the first embodiment will be described with reference to FIGS. 12 and 13. FIG. 12 is an exploded perspective view illustrating the semiconductor module 1 according to the second modification of the first embodiment. FIG. 13 is a partially enlarged cross-sectional view of the semiconductor module 1 according to the second modification of the first embodiment. In the second modification, the same reference numerals are assigned to portions corresponding to those in the above-described first embodiment to omit explanation. The second modification is different from the first embodiment in the flow of the coolant.

As illustrated in FIG. 12, in the first modification, the coolant is caused to flow from the second opening 9 into the heat sink 3. The coolant that has flowed from the second opening 9 into the heat sink 3 flows into the first common header region 52. Then, the coolant flows from the first common header region 52 into the first inter-fin flow paths 16 in the first divided regions 51. Next, the coolant flows from the first inter-fin flow paths 16 into the second inter-fin flow paths 21 in the second divided regions 61 through the junction flow paths 7. At this time, the coolant in the first inter-fin flow paths 16 in the first divided region 51a flows into the second inter-fin flow paths 21 in the second divided region 61a through the junction flow path 7a. The coolant in the first inter-fin flow paths 16 in the first divided region 51b flows into the second inter-fin flow paths 21 in the second divided region 61b through the junction flow path 7b. The coolant in the first inter-fin flow paths 16 in the first divided region 51c flows into the second inter-fin flow paths 21 in the second divided region 61c through the junction flow path 7c. The coolant in the first inter-fin flow paths 16 in the first divided region 51d flows into the second inter-fin flow paths 21 in the second divided region 61d through the junction flow path 7d. After that, the coolant flows from the second inter-fin flow paths 21 in the second divided regions 61 into the second common header region 62. Then, the coolant flows from the second common header region 62 to the outside of the heat sink 3 through the fourth opening 11, the third opening 10, and the first opening 8.

Next, the flow of the coolant in the first inter-fin flow paths 16 and the junction flow paths 7 will be described with reference to FIG. 13. The coolant flowing into the first inter-fin flow paths 16 flows toward the first partition walls 12. The coolant illustrated in FIG. 13 flows through the first inter-fin flow path 16 from the left to the right of the sheet of FIG. 13 and strikes the first partition wall 12. The coolant is changed in flow downward of the sheet of FIG. 13 by the first partition wall 12 and flows into the junction flow path 7. At this time, a vortex 23 is generated near the joint 22 between the heat transfer plate 31 and the first partition wall 12. The faster the flow velocity of the coolant flowing through the first inter-fin flow path 16, the smaller the scale of the vortex 23. Thus, the effect of the vortex 23 on the temperature rise of the heat transfer plate 31 and the first partition wall 12 is suppressed. When the coolant strikes the first partition wall 12, the boundary layer of the coolant becomes thinner, so that the first partition wall 12 can be efficiently cooled. The first partition walls 12, which are disposed near the central part of the semiconductor device 2, are portions to which heat from the central part of the semiconductor device 2 is easily transferred through the heat transfer plate 31. By the coolant striking the first partition walls 12, the first partition walls 12 can be intensively cooled, so that the temperature of the central part of the semiconductor device 2 can be efficiently lowered. Heat generated in the semiconductor device 2 is transferred to the coolant through the heat transfer plate 31, the first partition walls 12, and the first fins 13. Passing a sufficient amount of the coolant for the amount of heat generated by the semiconductor device 2 through the coolant flow path 4 can suppress the rise of the coolant temperature caused by heat transferred from the semiconductor device 2. Thus, the larger the amount of the coolant flow, the more efficiently the central part of the semiconductor device 2 can be cooled, so that the unevenness of the temperature distribution in the semiconductor device 2 can be reduced.

Figure 14:
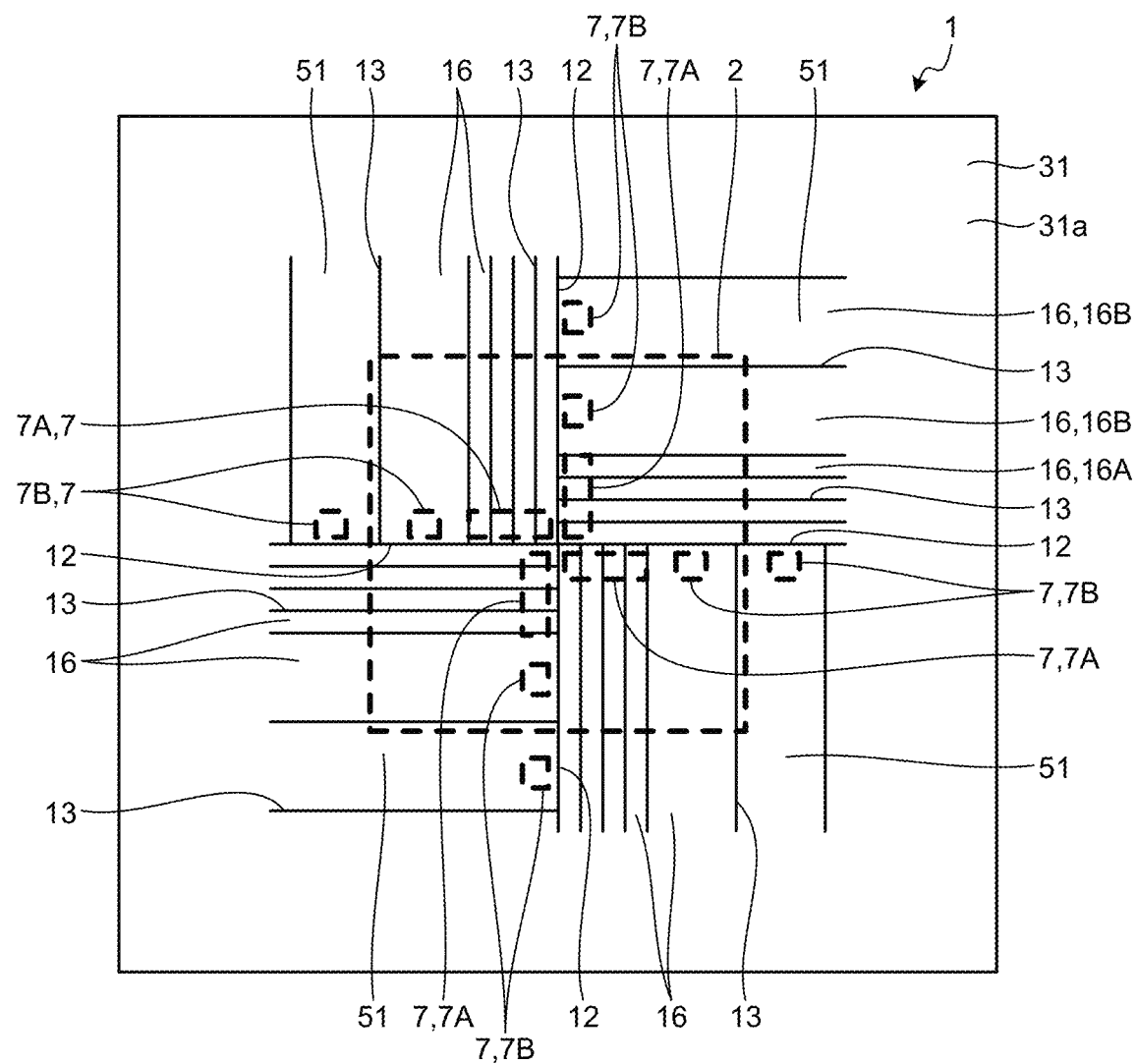
FIG. 14 is a diagram illustrating the semiconductor module according to a third modification of the first embodiment, and is a plan view illustrating the first partition walls, the first fins, and the junction flow paths projected onto the first surface.

Next, the semiconductor module 1 according to a third modification of the first embodiment will be described with reference to FIG. 14. FIG. 14 is a diagram illustrating the semiconductor module 1 according to the third modification of the first embodiment, and is a plan view illustrating the first partition walls 12, the first fins 13, and the junction flow paths 7 projected onto the first surface 31a. In FIG. 14, for ease of explanation, the first partition walls 12 and the first fins 13 are illustrated by solid lines, and the junction flow paths 7 and the semiconductor device 2 are illustrated by broken lines. In FIG. 14, for ease of explanation, the heat transfer plate 31 is drawn extremely small. In the third modification, the same reference numerals are assigned to portions corresponding to those in the above-described first embodiment to omit explanation. The third modification is different from the first embodiment in that the flow path width of the first inter-fin flow paths 16 is unequalized.

Each first divided region 51 is provided with the plurality of first inter-fin flow paths 16. In each first divided region 51, the flow path width of the first inter-fin flow paths 16 is unequal. The flow path width of the first inter-fin flow paths 16 is small in a position close to the central part of the semiconductor device 2 and is large in a position close to the outer peripheral part of the semiconductor device 2. In the first modification, six first inter-fin flow paths 16 are provided in each first divided region 51. The first four first inter-fin flow paths 16 on the side close to the central part of the semiconductor device 2 have the same flow path width. Hereinafter, these four first inter-fin flow paths 16 may sometimes be referred to as center-side inter-fin flow paths 16A. The remaining two first inter-fin flow paths 16 have the same flow path width. Hereinafter, these two first inter-fin flow paths 16 may sometimes be referred to as outer-peripheral-side inter-fin flow paths 16B. The flow path width of the outer-peripheral-side inter-fin flow paths 16B is larger than the flow path width of the center-side inter-fin flow paths 16A. In each first divided region 51, the first inter-fin flow paths 16 have the same flow path length.

In the first modification, three junction flow paths 7 are placed on each of the plurality of first divided regions 51. In each first divided region 51, the flow path area of the junction flow path 7 in the position close to the central part of the semiconductor device 2 is large, and the flow path area of the junction flow paths 7 in the position close to the outer peripheral part of the semiconductor device 2 is small. The flow path area of the junction flow path 7 closest to the central part of the semiconductor device 2 is larger than the flow path area of the remaining two junction flow paths 7. Hereinafter, the junction flow path 7 closest to the central part of the semiconductor device 2 may sometimes be referred to as a center-side junction flow path 7A, and the remaining two junction flow paths 7 may sometimes be referred to as outer-peripheral-side junction flow paths 7B. The two outer-peripheral-side junction flow paths 7B have the same flow path area. Each outer-peripheral-side junction flow path 7B communicates with the corresponding one of the outer-peripheral-side inter-fin flow paths 16B. Although not illustrated, the second inter-fin flow paths 21 have the same configuration as the first inter-fin flow paths 16. That is, the second inter-fin flow paths 21 having a small flow path width are provided in a position close to the central part of the semiconductor device 2, and the second inter-fin flow paths 21 having a large flow path width are provided in a position close to the outer peripheral part of the semiconductor device 2.

In the first modification, by making the flow path width of the first inter-fin flow paths 16 small in the position close to the central part of the semiconductor device 2 and large in the position close to the outer peripheral part of the semiconductor device 2, the first fins 13 can be densely disposed to dispose more first fins 13 in the position close to the central part of the semiconductor device 2. Consequently, the area of heat dissipation by the first fins 13 can be increased, and the number of points where the coolant strikes the second surface 31b of the heat transfer plate 31 can be increased in the position close to the central part of the semiconductor device 2 as compared with those at the outer peripheral part of the semiconductor device 2. This can further lower the temperature of the central part of the semiconductor device 2, reducing the unevenness of the temperature distribution in the semiconductor device 2. The flow path width of the first inter-fin flow paths 16 may be equalized as in the first embodiment, and, as in the first modification, the junction flow paths 7 having a large flow path area may be disposed in positions close to the central part of the semiconductor device 2, and the junction flow paths 7 having a small flow path area may be disposed in positions close to the outer peripheral part of the semiconductor device 2. This increases the amount of the coolant flow in the positions close to the central part of the semiconductor device 2 compared to that at the outer peripheral part of the semiconductor device 2. Consequently, the temperature of the central part of the semiconductor device 2 is lowered more than that of the outer peripheral part of the semiconductor device 2, and the unevenness of the temperature distribution in the semiconductor device 2 can be reduced.

When the flow path width of the first inter-fin flow paths 16 is narrowed in the positions close to the central part of the semiconductor device 2, and is widened in the positions close to the outer peripheral part of the semiconductor device 2, the pressure loss of the coolant differs between the first inter-fin flow paths 16 of the small flow path width and the first inter-fin flow paths 16 of the large flow path width, and an uneven flow may occur. In this regard, in the first modification, by increasing the flow path area of the junction flow paths 7 in the positions close to the central part of the semiconductor device 2 and reducing that in the positions close to the outer peripheral part of the semiconductor device 2, the pressure loss of the coolant can be adjusted to be equal between the first inter-fin flow paths 16 of the small flow path width and the first inter-fin flow paths 16 of the large flow path width. This allows adjustment to equalize the amount of the coolant flowing through the first inter-fin flow paths 16 of the small flow path width and the amount of the coolant flowing through the first inter-fin flow paths 16 of the large flow path width.

Figure 15:
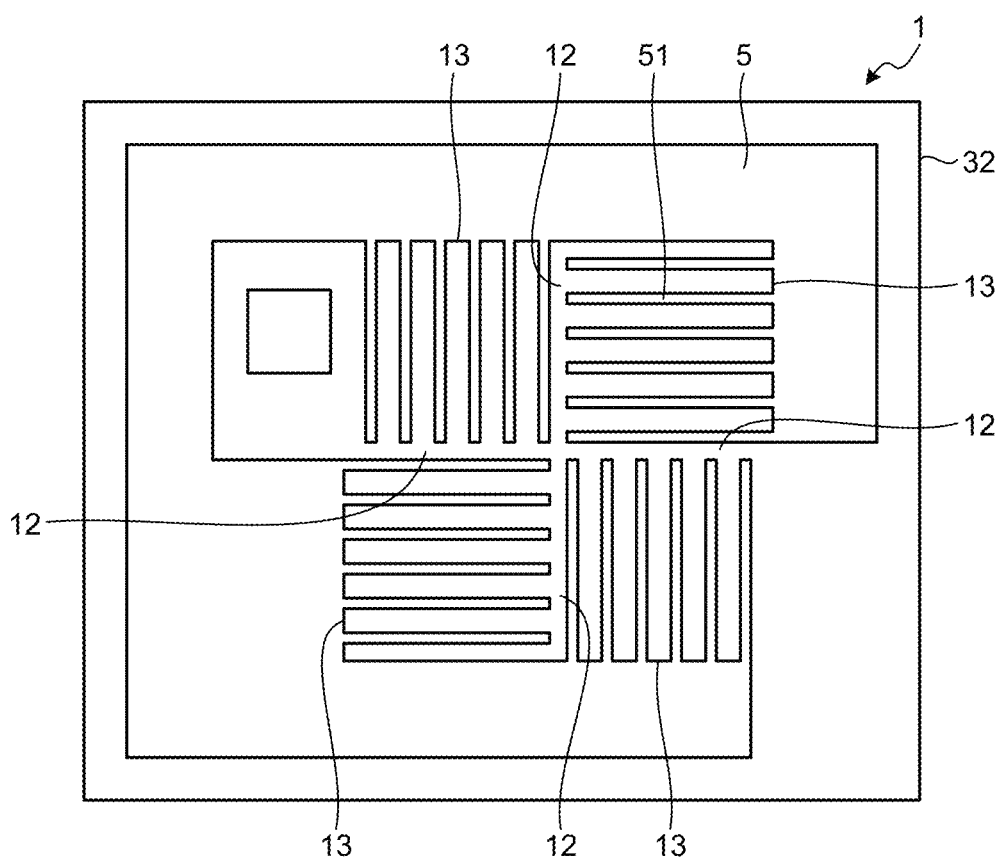
FIG. 15 is a plan view illustrating the first flow path-forming plate of the semiconductor module according to a fourth modification of the first embodiment.

Next, the semiconductor module 1 according to a fourth modification of the first embodiment will be described with reference to FIGS. 1, 9, and 15. FIG. 15 is a plan view illustrating the first flow path-forming plate 32 of the semiconductor module 1 according to the fourth modification of the first embodiment. In the fourth modification, the same reference numerals are assigned to portions corresponding to those in the above-described first embodiment to omit explanation. The fourth modification is different from the first embodiment in that the width of the first partition walls 12 is smaller than the width of the first fins 13.

The width of the first partition walls 12 is smaller than the width of the first fins 13. As described above, when the coolant flows into the heat sink 3 from the first opening 8 illustrated in FIG. 1, the coolant strikes the second surface 31b of the heat transfer plate 31 as illustrated in FIG. 9, and vortices 23 are generated near the joints 22 between the first partition walls 12 and the heat transfer plate 31. When such vortices 23 are generated, the heat exchange efficiency of the first partition walls 12 may become lower than the heat exchange efficiency of the first fins 13, decreasing the cooling effect on the central part of the semiconductor device 2. Thus, in the first modification, as illustrated in FIG. 15, by making the width of the first partition walls 12 smaller than the width of the first fins 13, the second surface 31b of the heat transfer plate 31 illustrated in FIG. 9 can be brought closer to the central part of the semiconductor device 2, and the contact area of the coolant coming into contact with the second surface 31b of the heat transfer plate 31 can be increased. Consequently, even when the vortices 23 are generated, the cooling effect on the central part of the semiconductor device 2 is enhanced.

Figure 16:
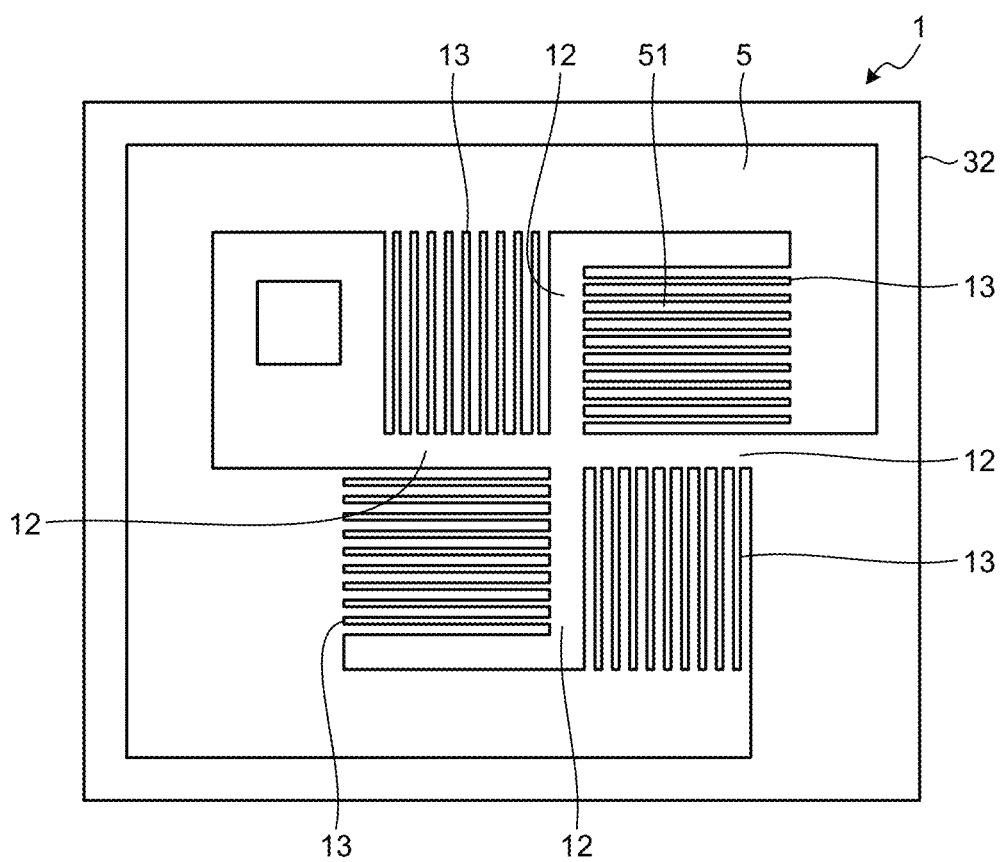
FIG. 16 is a plan view illustrating the first flow path-forming plate of the semiconductor module according to a fifth modification of the first embodiment.

Next, the semiconductor module 1 according to a fifth modification of the first embodiment will be described with reference to FIGS. 12, 13, and 16. FIG. 16 is a plan view illustrating the first flow path-forming plate 32 of the semiconductor module 1 according to the fifth modification of the first embodiment. In the fifth modification, the same reference numerals are assigned to portions corresponding to those in the above-described first embodiment to omit explanation. The fifth modification is different from the first embodiment in that the width of the first partition walls 12 is larger than the width of the first fins 13.

The width of the first partition walls 12 is larger than the width of the first fins 13. When the coolant flows into the heat sink 3 from the second opening 9 illustrated in FIG. 12, the coolant strikes the first partition walls 12 as illustrated in FIG. 13. When the coolant strikes the first partition walls 12 in this way, the heat exchange efficiency of the first partition walls 12 can become higher than the heat exchange efficiency of the first fins 13, and the first partition walls 12 may be eroded by the coolant striking them. Thus, in the first modification, as illustrated in FIG. 16, by making the width of the first partition walls 12 larger than the width of the first fins 13, the heat dissipation area of the first partition walls 12 can be increased, enhancing the cooling effect on the central part of the semiconductor device 2, and the life of the first partition walls 12 can be extended.

Figure 17:
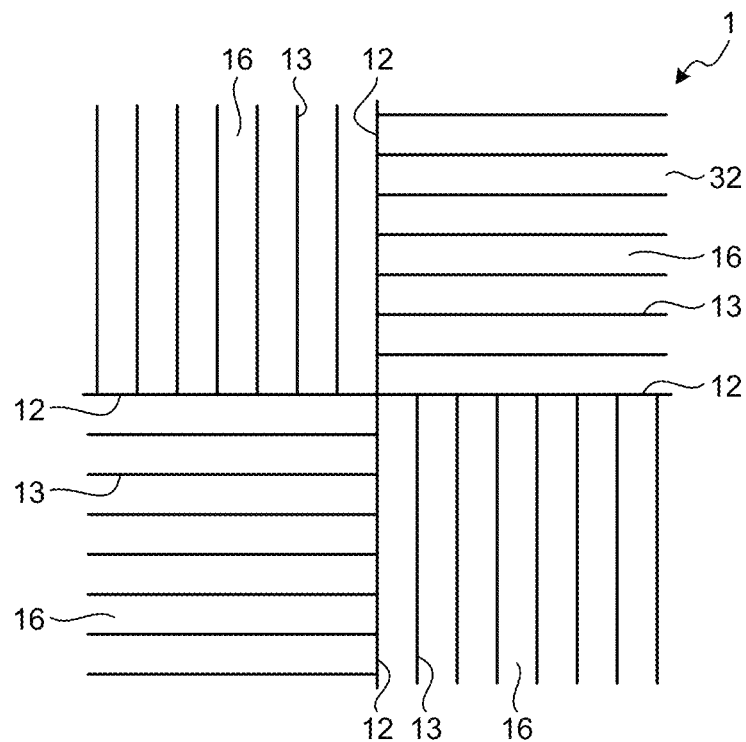
FIG. 17 is a plan view illustrating the first partition walls and the first fins of the semiconductor module according to a sixth modification of the first embodiment.
Figure 18:
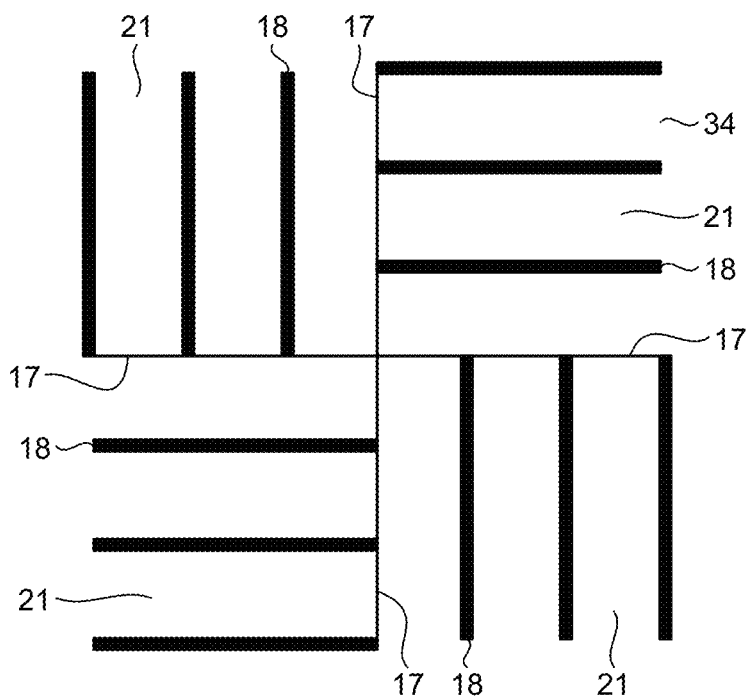
FIG. 18 is a plan view illustrating second partition walls and second fins of the semiconductor module according to the sixth modification of the first embodiment.

Next, the semiconductor module 1 according to a sixth modification of the first embodiment will be described with reference to FIGS. 1, 17, and 18. FIG. 17 is a plan view illustrating the first partition walls 12 and the first fins 13 of the semiconductor module 1 according to the sixth modification of the first embodiment. FIG. 18 is a plan view illustrating the second partition walls 17 and the second fins 18 of the semiconductor module 1 according to the sixth modification of the first embodiment. In the sixth modification, the same reference numerals are assigned to portions corresponding to those in the above-described first embodiment to omit explanation. The sixth modification is different from the first embodiment in that the flow path width of the second inter-fin flow paths 21 is larger than the flow path width of the first inter-fin flow paths 16, and the width of the second fins 18 is larger than the width of the first fins 13.

The flow path width of the second inter-fin flow paths 21 illustrated in FIG. 18 is larger than the flow path width of the first inter-fin flow paths 16 illustrated in FIG. 17. In other words, the installation interval between the second fins 18 is larger than the installation interval between the first fins 13. The width of the second fins 18 illustrated in FIG. 18 is larger than the width of the first fins 13 illustrated in FIG. 17.

As illustrated in FIG. 1, the second inter-fin flow paths 21 are placed farther from the semiconductor device 2 than the first inter-fin flow paths 16, and thus less contribute to the cooling of the semiconductor device 2 than the first inter-fin flow paths 16. On the other hand, the smaller the flow path width of the second inter-fin flow paths 21 is made, the larger the pressure loss of the coolant in the second inter-fin flow paths 21 becomes. Therefore, in the first modification, as illustrated in FIGS. 17 and 18, by making the flow path width of the second inter-fin flow paths 21 larger than the flow path width of the first inter-fin flow paths 16, the pressure loss of the coolant in the second inter-fin flow paths 21 can be reduced.

Here, the functions and effects of the first modification will be further described. For example, an insulating material that interrupts electric conduction may be disposed between the semiconductor device 2 and the heat transfer plate 31 illustrated in FIG. 1 to provide insulation between the semiconductor device 2 and the heat transfer plate 31. The material of the heat transfer plate 31 is, for example, copper. On the other hand, the material of the insulating material is, for example, aluminum nitride or silicon carbide. Since the heat transfer plate 31 and the insulating material are formed of different types of materials, there is a difference in thermal expansion coefficient between the heat transfer plate 31 and the insulating material. Therefore, warpage occurs in the heat transfer plate 31 when the heat transfer plate 31 and the insulating material are cooled after the heat transfer plate 31 and the insulating material have risen in temperature at the time of joining of the heat transfer plate 31 and the insulating material. When warpage occurs in the heat transfer plate 31, warpage also occurs in the other plates 32 to 35, and the entire heat sink 3 warps.

As a way to reduce such warpage of the heat sink 3, a possible way is not only join an insulating material to the heat transfer plate 31 but also join an insulating material to the bottom plate 35 so that the heat transfer plate 31 and the bottom plate 35 have almost the same configuration. As another way to reduce the warpage of the heat sink 3, a possible way is to configure the first flow path-forming plate 32 and the second flow path-forming plate 34 almost the same. In the first embodiment, the latter way is adopted, and the configuration of the first fins 13 in the first flow path-forming plate 32 and the configuration of the second fins 18 in the second flow path-forming plate 34 are made the same. That is, the installation interval between the first fins 13 and the installation interval between the second fins 18 are made equal, and the width of the first fins 13 and the width of the second fins 18 are made equal.

On the other hand, when the installation interval between the second fins 18 is made larger than the installation interval between the first fins 13 with emphasis on reducing the pressure loss of the coolant in the second inter-fin flow paths 21 as in the first modification illustrated in FIGS. 17 and 18, the warpage of the heat sink 3 cannot be reduced. In this regard, in the first modification, by making the width of the second fins 18 larger than the width of the first fins 13, the rigidity of the second fins 18 can be increased to suppress the warpage of the heat sink 3. That is, in the first modification, by making the flow path width of the second inter-fin flow paths 21 larger than the flow path width of the first inter-fin flow paths 16, the pressure loss of the coolant in the second inter-fin flow paths 21 can be reduced, and by making the width of the second fins 18 larger than the width of the first fins 13, the warpage of the heat sink 3 can be suppressed. The warpage of the heat sink 3 may be reduced by increasing not only the width of the second fins 18 but also the width of the first fins 13. The warpage of the heat sink 3 may be reduced by increasing only the width of the first fins 13.

Second Embodiment

Figure 19:
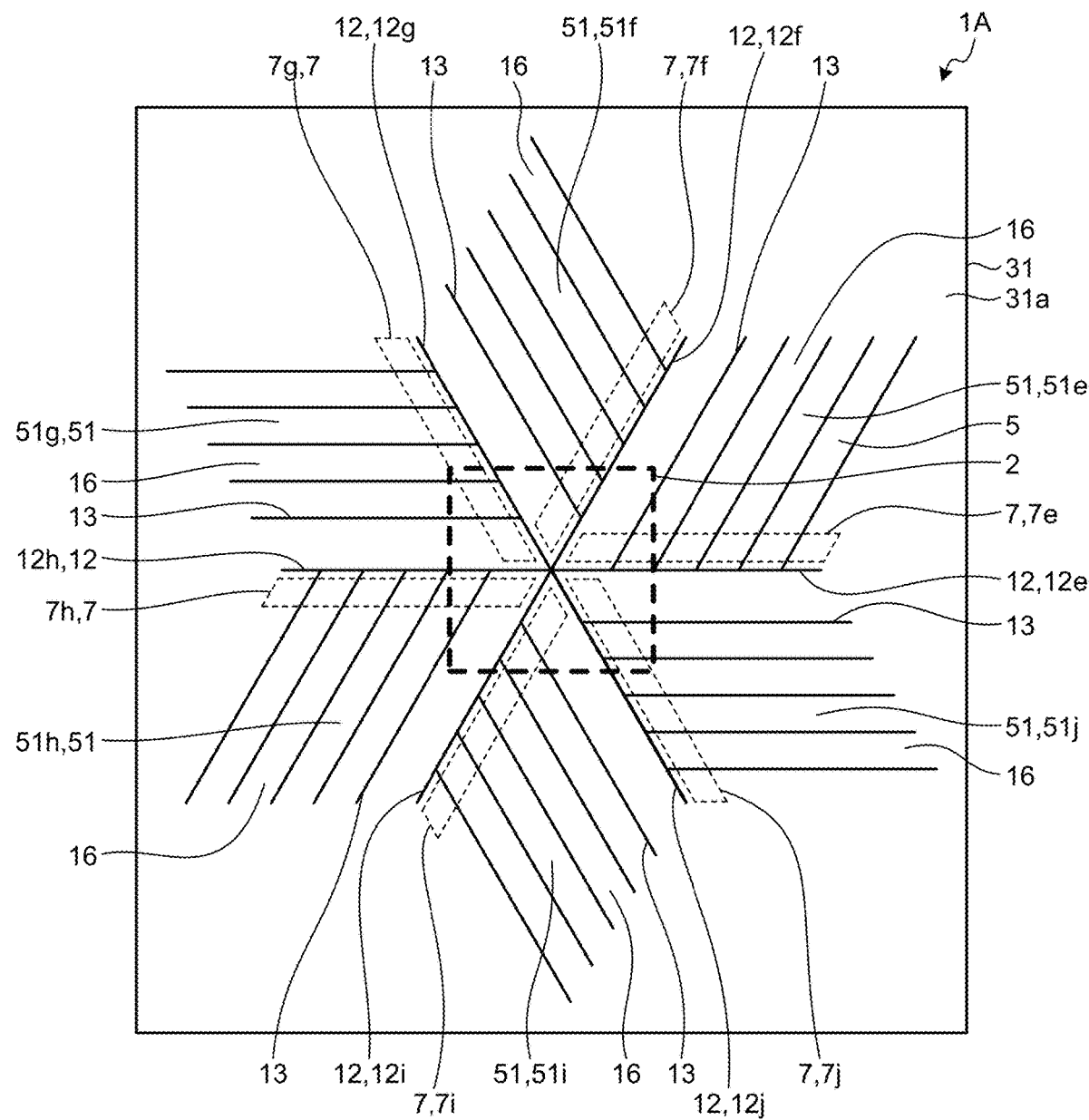
FIG. 19 is a diagram illustrating a semiconductor module according to a second embodiment of the present invention, and is a plan view illustrating first partition walls, first fins, and junction flow paths projected onto a first surface.

Next, a semiconductor module 1A according to a second embodiment of the present invention will be described with reference to FIG. 19. FIG. 19 is a diagram illustrating the semiconductor module 1A according to the second embodiment of the present invention, and is a plan view illustrating the first partition walls 12, the first fins 13, and the junction flow paths 7 projected onto the first surface 31a. In FIG. 19, for ease of explanation, the first partition walls 12 and the first fins 13 are illustrated by solid lines, and the junction flow paths 7 and the semiconductor device 2 are illustrated by broken lines. In FIG. 19, for ease of explanation, the heat transfer plate 31 is drawn extremely small. In the second embodiment, the same reference numerals are assigned to portions corresponding to those in the above-described first embodiment to omit explanation. The second embodiment is different from the first embodiment in that six first divided regions 51 are provided.

In the second embodiment, part of the first flow path 5 is divided into the six first divided regions 51 by six first partition walls 12. The six first partition walls 12 extend radially from a center point. The six first partition walls 12 are disposed at 60 degree intervals along a circumferential direction around the center point. When the six first partition walls 12 are distinguished, they are referred to as first partition walls 12e, 12f, 12g, 12h, 12i, and 12j. When the six first divided regions 51 are distinguished, they are referred to as first divided regions 51e, 51f, 51g, 51h, 51i, and 51j. Although not illustrated, part of the second flow path 6 is also divided into six second divided regions 61 by six second partition walls 17.

Six junction flow paths 7 are disposed at 60 degree intervals along a circumferential direction around a center point. When the six junction flow paths 7 are distinguished, they are referred to as junction flow paths 7e, 7f, 7g, 7h, 7i, and 7j. In a planar view, the first divided region 51e and the junction flow path 7e coincide with each other. In a planar view, the first divided region 51f and the junction flow path 7f coincide with each other. In a planar view, the first divided region 51g and the junction flow path 7g coincide with each other. In a planar view, the first divided region 51h and the junction flow path 7h coincide with each other. In a planar view, the first divided region 51i and the junction flow path 7i coincide with each other. In a planar view, the first divided region 51j and the junction flow path 7j coincide with each other.

Positions when part of the first partition walls 12, part of the first fins 13, and part of the first inter-fin flow paths 16 are projected onto the first surface 31a coincide with the semiconductor device 2. In the second embodiment, the center point of the six first partition walls 12 coincides with the central part of the semiconductor device 2. A position where a part of the first partition walls 12 is projected onto the first surface 31a coincides with the central part of the semiconductor device 2 and the periphery of the central part of the semiconductor device 2. Positions when part of the first fins 13 and part of the first inter-fin flow paths 16 are projected onto the first surface 31a coincide with the periphery of the central part of the semiconductor device 2. Although the position when part of the first partition walls 12 are projected onto the first surface 31a coincide with the central part of the semiconductor device 2 in the second embodiment, the position when part of the first fins 13 are projected onto the first surface 31a may coincide with the central part of the semiconductor device 2.

When the junction flow paths 7, the first divided regions 51, and the first fins 13 are projected onto the first surface 31a, each junction flow path 7 is disposed at a position that coincides with the corresponding one of the plurality of first divided regions 51, and is formed elongatedly across the plurality of first fins 13. The length direction of each junction flow path 7 is orthogonal to the length direction of the first fins 13. Each junction flow path 7 is disposed at a position that coincides with root portions of the first fins 13 connected to the first partition wall 12.

In the second embodiment, part of the first flow path 5 is divided into the six first divided regions 51 by the six first partition walls 12. When the junction flow paths 7, the first divided regions 51, and the first fins 13 are projected onto the first surface 31a, each junction flow path 7 coincides with the corresponding one of the plurality of first divided regions 51. Consequently, the coolant flows from the junction flow paths 7 into the first divided regions 51, and the coolant strikes the second surface 31b of the heat transfer plate 31 in the first divided regions 51. As a result, compared to the heat sink 3 according to the first embodiment in which the four first divided regions 51 are provided, the number of points where the coolant strikes the second surface 31b of the heat transfer plate 31 is increased, enhancing the cooling effect on the central part of the semiconductor device 2. In the second embodiment, to approximately equalize the pressure loss of the coolant in the first inter-fin flow paths 16, the lengths of the first fins 13 in the first divided regions 51 are made approximately equal. However, the first fins 13 in the first divided regions 51 may have different lengths.

Third Embodiment

Figure 20:
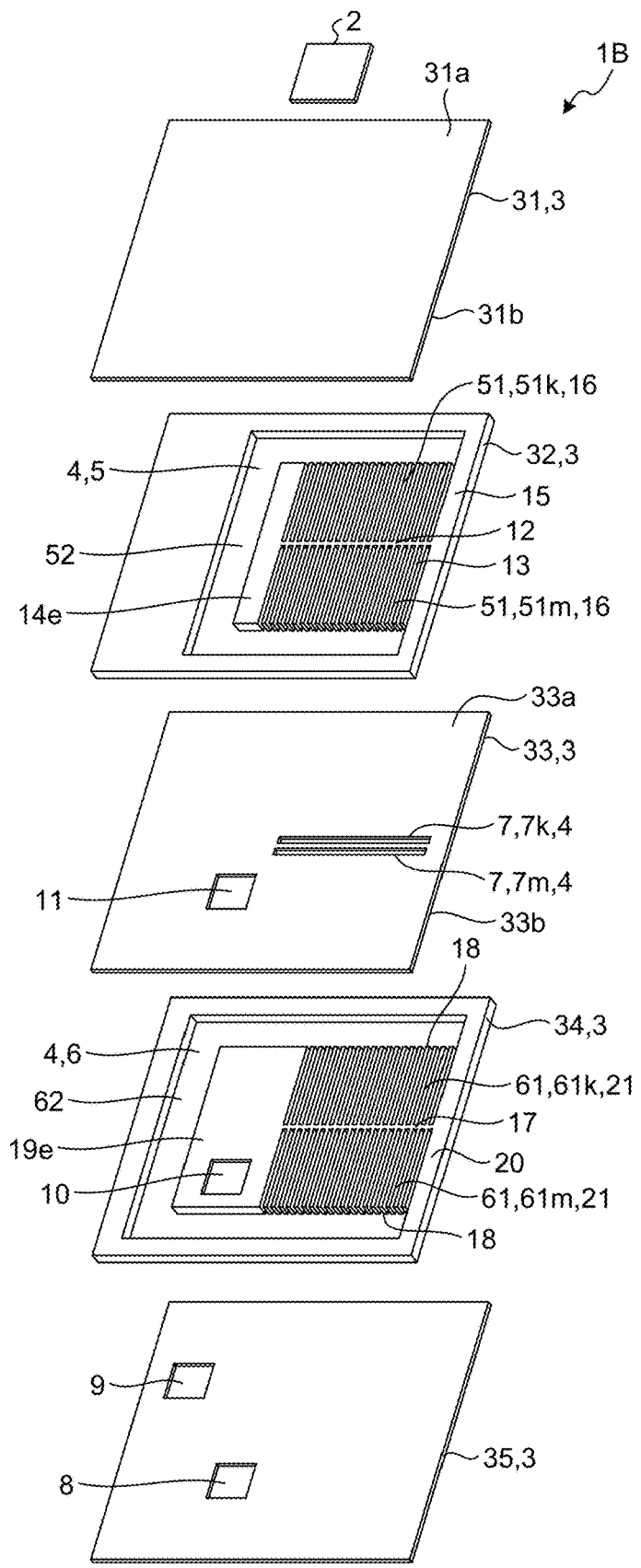
FIG. 20 is an exploded perspective view illustrating a semiconductor module according to a third embodiment of the present invention.
Figure 21:
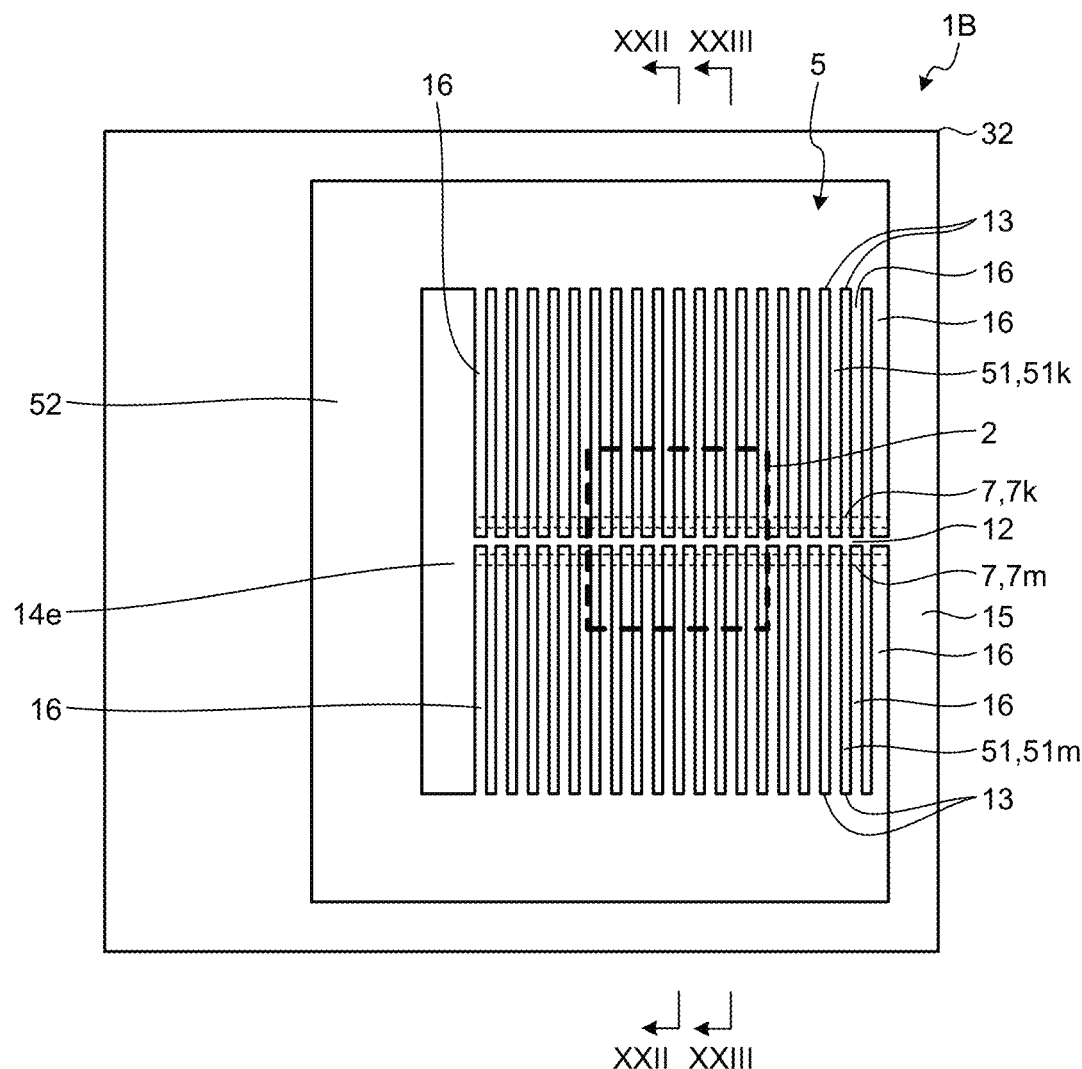
FIG. 21 is a plan view illustrating a first flow path-forming plate of the semiconductor module according to the third embodiment.
Figure 22:
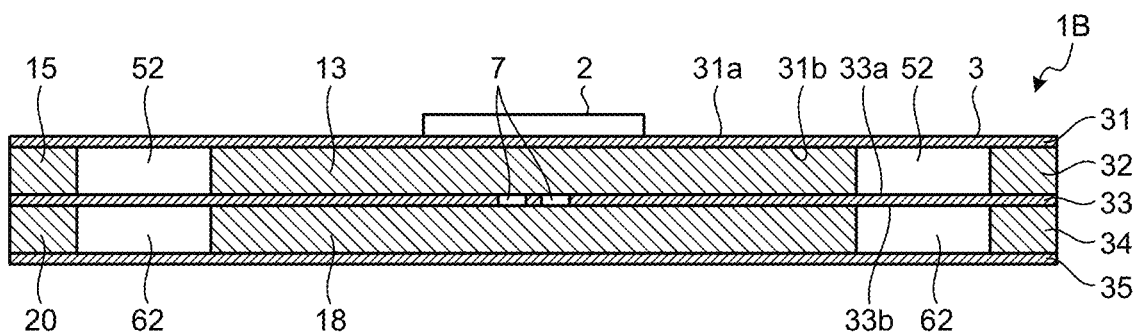
FIG. 22 is a cross-sectional view of the semiconductor module taken along line XXII-XXII illustrated in FIG. 21.
Figure 23:
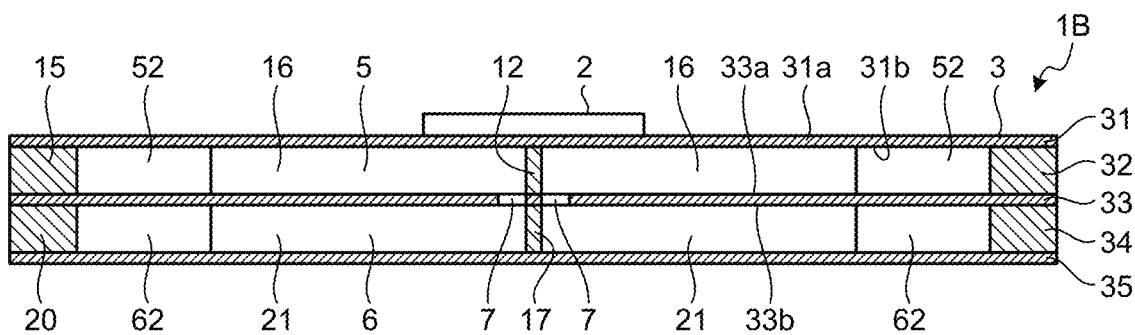
FIG. 23 is a cross-sectional view of the semiconductor module taken along line XXIII-XXIII illustrated in FIG. 21.

Next, a semiconductor module 1B according to a third embodiment of the present invention will be described with reference to FIGS. 20 to 23. FIG. 20 is an exploded perspective view illustrating the semiconductor module 1B according to the third embodiment of the present invention. FIG. 21 is a plan view illustrating the first flow path-forming plate 32 of the semiconductor module 1B according to the third embodiment. FIG. 22 is a cross-sectional view of the semiconductor module 1B taken along line XXII-XXII illustrated in FIG. 21. FIG. 23 is a cross-sectional view of the semiconductor module 1B taken along line XXIII-XXIII illustrated in FIG. 21. In FIG. 21, for explanatory convenience, the semiconductor device 2 and the junction flow paths 7 are illustrated by broken lines. In FIG. 21, for explanatory convenience, only the first flow path-forming plate 32 of the heat sink 3 is illustrated, and the positions of the cross sections of the semiconductor module 1B illustrated in FIGS. 22 and 23 are indicated using the first flow path-forming plate 32. In the third embodiment, the same reference numerals are assigned to portions corresponding to those in the above-described first embodiment to omit explanation. The third embodiment is different from the first embodiment in that the first opening 8 and the second opening 9 are provided in the bottom plate 35, the third opening 10 is provided in the second flow path-forming plate 34, and two first divided regions 51 are provided.

As illustrated in FIG. 20, the heat sink 3 is formed by stacking the heat transfer plate 31, the first flow path-forming plate 32, the junction flow path-forming plate 33, the second flow path-forming plate 34, and the bottom plate 35. From the side closer to the semiconductor device 2, the heat transfer plate 31, the first flow path-forming plate 32, the junction flow path-forming plate 33, the second flow path-forming plate 34, and the bottom plate 35 are arranged in this order. The heat transfer plate 31 is a flat plate without openings. In the third embodiment, the first opening 8 and the second opening 9 are formed in the bottom plate 35. The first opening 8 and the second opening 9 are provided in positions away from each other. The first opening 8 and the second opening 9 pass through the bottom plate 35 in the thickness direction of the bottom plate 35. One of the first opening 8 and the second opening 9 serves as a coolant inlet. The other of the first opening 8 and the second opening 9 serves as a coolant outlet.

In the third embodiment, the third opening 10 is formed in the second flow path-forming plate 34. The third opening 10 passes through the second flow path-forming plate 34 in the thickness direction of the second flow path-forming plate 34. A second dividing wall 19e is provided around the third opening 10. The third opening 10 is separated from the second divided regions 61 and the second common header region 62 by the second dividing wall 19e. This prevents the coolant flowing through the third opening 10 from meeting the coolant flowing through the second divided regions 61 and the second common header region 62. In a planar view, the first opening 8, the third opening 10, the fourth opening 11, and the first common header region 52 are disposed at a position that coincides with each other. The first opening 8, the third opening 10, the fourth opening 11, and the first common header region 52 communicate with each other.

As illustrated in FIG. 21, in the third embodiment, part of the first flow path 5 is divided into the two first divided regions 51 by one first partition wall 12. The first partition wall 12 extends linearly along the left-right direction of the sheet of FIG. 21. When the two first divided regions 51 are distinguished, they are referred to as first divided regions 51k and 51m. The first partition wall 12 protrudes inward from a side of the first outer peripheral wall 15 in a rectangular annular shape. The distal end of the first partition wall 12 is connected to a first dividing wall 14e in a rectangular shape. One of two spaces partitioned off by the first partition wall 12, the side of the first outer peripheral wall 15, and the first dividing wall 14e is the first divided region 51k. The other of the two spaces partitioned off by the first partition wall 12, the side of the first outer peripheral wall 15, and the first dividing wall 14e is the first divided region 51m.

The plurality of first fins 13 are disposed in each first divided regions 51. The plurality of first fins 13 are arranged by being spaced side by side in parallel. The first fins 13 in all the first divided regions 51 are installed at equal intervals. The first fins 13 protrude from the first partition wall 12 toward the first divided regions 51. One end of each first fin 13 along the length direction is connected to the first partition wall 12. The other end of each first fin 13 along the length direction faces the first common header region 52. The first fins 13 disposed in the adjacent first divided regions 51 protrude in opposite directions from the same first partition wall 12. The first fins 13 protrude from one end face of the first partition wall 12 along the width direction and the other end face of the first partition wall 12 along the width direction. The first inter-fin flow paths 16 are formed between the adjacent first fins 13 and 13, between the first fins 13 and the side of the first outer peripheral wall 15 adjacent to each other, and between the first fins 13 and the first dividing wall 14e adjacent to each other.

As illustrated in FIG. 20, in the third embodiment, part of the second flow path 6 is divided into two second divided regions 61 by one second partition wall 17. The second partition wall 17 extends linearly along the left-right direction of the sheet of FIG. 20. When the two second divided regions 61 are distinguished, they are referred to as second divided regions 61k and 61m. In a planar view, the second common header region 62 is disposed at a position that coincides with the second opening 9. The second common header region 62 communicates with the second opening 9.

The second partition wall 17 protrudes inward from a side of the second outer peripheral wall 20 in a rectangular annular shape. The distal end of the second partition wall 17 is connected to the second dividing wall 19e in a rectangular shape. One of two spaces partitioned off by the second partition wall 17, the side of the second outer peripheral wall 20, and the second dividing wall 19e is the second divided region 61k. The other of the two spaces partitioned off by the second partition wall 17, the side of the second outer peripheral wall 20, and the second dividing wall 19e is the second divided region 61m.

The plurality of second fins 18 are disposed in each second divided region 61. The plurality of second fins 18 are arranged by being spaced side by side in parallel. The second fins 18 in all the second divided regions 61 are installed at equal intervals. The second fins 18 protrude from the second partition wall 17 toward the second divided regions 61. One end of each second fin 18 along the length direction is connected to the second partition wall 17. The other end of each second fin 18 along the length direction faces the second common header region 62. The second fins 18 disposed in the adjacent second divided regions 61 protrude in opposite directions from the same second partition wall 17. The second fins 18 protrude from one end face of the second partition wall 17 along the width direction and the other end face of the second partition wall 17 along the width direction. The second inter-fin flow paths 21 are formed between the adjacent second fins 18 and 18, between the second fins 18 and the side of the second outer peripheral wall 20 adjacent to each other, and between the second fins 18 and the second dividing wall 19e adjacent to each other. The length direction of the first fins 13 in the first divided region 51k and the length direction of the second fins 18 in the second divided region 61k are parallel to each other. The length direction of the first fins 13 in the first divided region 51m and the length direction of the second fins 18 in the second divided region 61m are parallel to each other.

As illustrated in FIG. 22, the first fins 13 are provided in contact with the second surface 31b of the heat transfer plate 31 and the third surface 33a of the junction flow path-forming plate 33. The second fins 18 are provided in contact with the fourth surface 33b of the junction flow path-forming plate 33 and the bottom plate 35.

As illustrated in FIG. 23, the first partition wall 12 is provided in contact with the second surface 31b of the heat transfer plate 31 and the third surface 33a of the junction flow path-forming plate 33. The first outer peripheral wall 15 is provided in contact with the second surface 31b of the heat transfer plate 31 and the third surface 33a of the junction flow path-forming plate 33. The second partition wall 17 is provided in contact with the fourth surface 33b of the junction flow path-forming plate 33 and the bottom plate 35. The second outer peripheral wall 20 is provided in contact with the fourth surface 33b of the junction flow path-forming plate 33 and the bottom plate 35. The first inter-fin flow paths 16 and the second inter-fin flow paths 21 communicate with each other through the junction flow paths 7. The width of the first partition wall 12 and the width of the second partition wall 17 are equal. The width of the first fins 13 and the width of the second fins 18 are equal. The installation interval between the first fins 13 is equal to the installation interval between the second fins 18.

As illustrated in FIG. 20, two junction flow paths 7 are placed at a distance from each other. When the two junction flow paths 7 are distinguished, they are referred to as junction flow paths 7k and 7m. In a planar view, the first divided region 51k, the second divided region 61k, and the junction flow path 7k are disposed at a position that coincides with each other. In a planar view, the first divided region 51m, the second divided region 61m, and the junction flow path 7m are disposed at a position that coincides with each other.

As illustrated in FIG. 21, a position where part of the first partition wall 12, part of the first fins 13, and part of the first inter-fin flow paths 16 are projected onto the first surface 31a (not illustrated) coincides with the semiconductor device 2. In the third embodiment, the center point of the first partition wall 12 coincides with the central part of the semiconductor device 2. A position where a part of the first partition wall 12 is projected onto the first surface 31a coincides with the central part of the semiconductor device 2 and the periphery of the central part of the semiconductor device 2. A position where part of the first fins 13 and part of the first inter-fin flow paths 16 are projected onto the first surface 31a coincides with the periphery of the central part of the semiconductor device 2. Although a position where a part of the first partition wall 12 is projected onto the first surface 31a coincides with the central part of the semiconductor device 2 in the third embodiment, a position where a part of the first fins 13 is projected onto the first surface 31a may coincide with the central part of the semiconductor device 2.

When the junction flow paths 7, the first divided regions 51, and the first fins 13 are projected onto the first surface 31a, each junction flow path 7 coincides with the corresponding one of the plurality of first divided regions 51 and is formed elongatedly across the plurality of first fins 13. The length direction of each junction flow path 7 is orthogonal to the length direction of the first fins 13. Each junction flow path 7 coincides with root portions of the first fins 13 connected to the first partition wall 12.

Next, the flow of the coolant will be described with reference to FIG. 20. First, a case where the coolant is caused to flow in from the first opening 8 will be described. The coolant that has flowed from the first opening 8 into the heat sink 3 flows into the first common header region 52 through the third opening 10 and the fourth opening 11. Then, the coolant flows from the first common header region 52 into the first inter-fin flow paths 16 in the first divided regions 51. Next, the coolant flows from the first inter-fin flow paths 16 into the second inter-fin flow paths 21 in the second divided regions 61 through the junction flow paths 7. At this time, the coolant in the first inter-fin flow paths 16 in the first divided region 51k flows into the second inter-fin flow paths 21 in the second divided region 61k through the junction flow path 7k. The coolant in the first inter-fin flow paths 16 in the first divided region 51m flows into the second inter-fin flow paths 21 in the second divided region 61m through the junction flow path 7m. After that, the coolant flows from the second inter-fin flow paths 21 in the second divided regions 61 into the second common header region 62. Then, the coolant flows from the second common header region 62 to the outside of the heat sink 3 through the second opening 9.

Next, a case where the coolant is caused to flow in from the second opening 9 will be described. The coolant that has flowed from the second opening 9 into the heat sink 3 flows into the second common header region 62. Then, the coolant flows from the second common header region 62 into the second inter-fin flow paths 21 in the second divided regions 61. Then, the coolant flows from the second inter-fin flow paths 21 into the first inter-fin flow paths 16 in the first divided regions 51 through the junction flow paths 7. At this time, the coolant in the second inter-fin flow paths 21 in the second divided region 61k flows into the first inter-fin flow paths 16 in the first divided region 51k through the junction flow path 7k. The coolant in the second inter-fin flow paths 21 in the second divided region 61m flows into the first inter-fin flow paths 16 in the first divided region 51m through the junction flow path 7m. After that, the coolant flows from the first inter-fin flow paths 16 in the first divided regions 51 into the first common header region 52. Then, the coolant flows from the first common header region 52 to the outside of the heat sink 3 through the fourth opening 11, the third opening 10, and the first opening 8.

In the third embodiment, part of the first flow path 5 is divided into the two first divided regions 51 by the first partition wall 12. Part of the second flow path 6 is divided into the two second divided regions 61 by the second partition wall 17. The two junction flow paths 7 are formed in the junction flow path-forming plate 33. Therefore, compared to the heat sink 3 according to the first embodiment in which the four first divided regions 51, the four second divided regions 61, and the four junction flow paths 7 are formed, the configuration of the first flow path 5, the second flow path 6, and the junction flow paths 7 is simpler, so that the production cost of the heat sink 3 can be reduced.

The first opening 8 and the second opening 9 may be provided in the heat transfer plate 31 or the bottom plate 35, depending on the use conditions of the heat sink 3. In the third embodiment, the number of plates forming the heat sink 3 is five, but the number of plates forming the heat sink 3 may be six or more. In the third embodiment, the heat sink 3 is formed of the plurality of plates 31 to 35, but the heat sink 3 may be integrally formed using a 3D printer or the like.

The configurations shown in the above embodiments show an example of the subject matter of the present invention, and can be combined with another known art, and can be partly omitted or changed without departing from the scope of the present invention.

REFERENCE SIGNS LIST 1, 1A, 1B semiconductor module; 2 semiconductor device; 3 heat sink; 4 coolant flow path; 5 first flow path; 6 second flow path; 7, 7a, 7b, 7c, 7d, 7e, 7f, 7g, 7h, 7i, 7j, 7k, 7m junction flow path; 7A center-side junction flow path; 7B outer-peripheral-side junction flow path; 8 first opening; 9 second opening; 10 third opening; 11 fourth opening; 12, 12a, 12b, 12c, 12d, 12e, 12f, 12g, 12h, 12i, 12j first partition wall; 13 first fin; 14a, 14b, 14c, 14e first dividing wall; 15 first outer peripheral wall; 16 first inter-fin flow path; 16A center-side inter-fin flow path; 16B outer-peripheral-side inter-fin flow path; 17, 17a, 17b, 17c, 17d second partition wall; 18 second fin; 19a, 19b, 19c, 19e second dividing wall; 20 second outer peripheral wall; 21 second inter-fin flow path; 22 joint; 23 vortex; 24 central partition wall; 31 heat transfer plate; 31a first surface; 31b second surface; 32 first flow path-forming plate; 33 junction flow path-forming plate; 33a third surface; 33b fourth surface; 34 second flow path-forming plate; 35 bottom plate; 51, 51a, 51b, 51c, 51d, 51e, 51f, 51g, 51h, 51i, 51j, 51k, 51m first divided region; 52 first common header region; 61, 61a, 61b, 61c, 61d, 61k, 61m second divided region; 62 second common header region.

The invention claimed is:
1. A heat sink, comprising:
a first plate having a first surface on which an object to be cooled is disposed and a second surface that is a back surface of the first surface;
a second plate having a third surface facing the second surface and a fourth surface that is a back surface of the third surface;
at least one first partition wall in contact with the second surface of the first plate and the third surface of the second plate;
a plurality of first fins in contact with the second surface of the first plate; and a coolant flow path including a first flow path between the first plate and the second plate,
wherein:
a plurality of first divided regions separated by the at least one first partition wall are in the first flow path,
the plurality of first fins are arranged by being spaced side by side in the first divided regions,
the first partition wall is connected to one end of each of the plurality of first fins, and
a position where at least part of the at least one first partition wall is projected onto the first surface or a position where at least part of the first fins is projected onto the first surface coincides with a central part of the object to be cooled,
wherein the heat sink further comprises:
a third plate disposed opposite the first plate across the second plate, wherein
the coolant flow path further includes
a second flow path between the second plate and the third plate, and
a plurality of junction flow paths in the second plate to connect the first flow path and the second flow path.

2. The heat sink according to claim 1, wherein when the junction flow paths, the first divided regions, and the first fins are projected onto the first surface, at least one of the junction flow paths is disposed at a position that coincides with each of the plurality of first divided regions and is elongatedly across the plurality of first fins.

3. The heat sink according to claim 1, wherein
the at least one first partition wall comprises a plurality of radially extending walls,
the first fins protrude from the first partition walls toward the first divided regions, and
the first fins arranged in the first divided regions adjacent to each other protrude from the first partition walls different from each other.

4. The heat sink according to claim 3, wherein the junction flow paths are disposed at positions that coincide with root portions of the first fins connected to the first partition walls.

5. A heat sink, comprising:
a first plate having a first surface on which an object to be cooled is disposed and a second surface that is a back surface of the first surface;
a second plate having a third surface facing the second surface and a fourth surface that is a back surface of the third surface;
at least one first partition wall in contact with the second surface of the first plate and the third surface of the second plate;
a plurality of first fins in contact with the second surface of the first plate; and
a coolant flow path including a first flow path between the first plate and the second plate,
wherein:
a plurality of first divided regions separated by the at least one first partition wall are in the first flow path,
the plurality of first fins are arranged by being spaced side by side in the first divided regions,
the first partition wall is connected to one end of each of the plurality of first fins, and
a position where at least part of the at least one first partition wall is projected onto the first surface or a position where at least part of the first fins is projected onto the first surface coincides with a central part of the object to be cooled,
wherein:
first inter-fin flow paths through which the coolant flows are between the first fins adjacent to each other,
a first header region surrounds the plurality of first divided regions in the first flow path, and
the first header region communicates with the first inter-fin flow paths in the first divided regions.

6. The heat sink according to claim 1, wherein
the plurality of first divided regions includes four first divided regions in the first flow path.

7. The heat sink according to claim 1, wherein the first fins in the first divided regions are installed at unequal intervals.

8. The heat sink according to claim 1, wherein the width of the at least one first partition wall is smaller than the width of the first fins.

9. The heat sink according to claim 1, further comprising:
at least one second partition wall in contact with the fourth surface of the second plate and the third plate; and
a plurality of second fins in contact with the fourth surface of the second plate and the third plate, wherein
a plurality of second divided regions separated by the at least one second partition wall are in the second flow path,
the plurality of second fins are arranged by being spaced side by side in the second divided regions, and
an installation interval between the second fins is larger than an installation interval between the first fins.

10. The heat sink according to claim 9, wherein the width of the second fins is larger than the width of the first fins.

11. A heat sink having a coolant flow path formed inside through which a coolant to cool an object to be cooled flows, wherein
the coolant flow path is formed hierarchically to include:
a first flow path closest to a first surface on which the object to be cooled is disposed,
a second flow path formed on a side farther away from the first surface than the first flow path in a normal direction of the first surface, and
junction flow paths placed between the first flow path and the second flow path to connect the first flow path and the second flow path,
the first flow path has as inner surfaces a second surface on the first surface side and a third surface facing the second surface,
a plurality of first divided regions separated by a first partition wall provided between the second surface and the third surface are formed in the first flow path,
the first divided regions include a plurality of first fins arranged by being spaced side by side and formed to extend from the first partition wall,
a position where at least part of the first partition wall is projected onto the first surface or a position where at least part of the first fins when projected onto the first surface coincides with a central part of a region of the first surface where the object to be cooled is installed,
when the junction flow paths, the first divided regions, and the first fins are projected onto the first surface, at least one of the junction flow paths is disposed at a position that coincides with each of the plurality of first divided regions, and is formed elongatedly across the plurality of first fins along the first partition wall, and
the coolant flows between the first flow path and the second flow path through the junction flow paths.

12. A semiconductor module comprising:
the heat sink according to claim 1; and
a semiconductor device that is the object to be cooled disposed on the first surface.

13. A semiconductor module comprising:
the heat sink according to claim 11; and
a semiconductor device that is the object to be cooled disposed on the first surface.

* * * * *